(12) United States Patent
Ben Basat et al.

(10) Patent No.: US 12,352,827 B1
(45) Date of Patent: Jul. 8, 2025

(54) SYSTEMS DEVICES AND METHODS FOR ADVANCED CABLE TESTING

(71) Applicant: GISTECH TECHNOLOGIES 2023 LTD, Hod HaSharon (IL)

(72) Inventors: Moshe Ben Basat, Kfar Saba (IL); Eran Glikman, Hod HaSharon (IL); Zvi Biener, Ness Ziona (IL)

(73) Assignee: GISTECH TECHNOLOGIES 2023 LTD., Hod Hasharon (IL)

( * ) Notice: Subject to any disclaimer, the term of this patent is extended or adjusted under 35 U.S.C. 154(b) by 0 days.

(21) Appl. No.: 18/902,985

(22) Filed: Oct. 1, 2024

(51) Int. Cl.
*G01R 31/58* (2020.01)

(52) U.S. Cl.
CPC .................. *G01R 31/58* (2020.01)

(58) Field of Classification Search
CPC ...................................... G01R 31/58
See application file for complete search history.

(56) References Cited

U.S. PATENT DOCUMENTS

| | | | | |
|---|---|---|---|---|
| 5,155,440 | A * | 10/1992 | Huang | G01R 31/58 |
| | | | | 324/66 |
| 6,772,380 | B1 * | 8/2004 | Ali | G01R 31/69 |
| | | | | 714/724 |
| 7,915,898 | B1 * | 3/2011 | Kraemer | G01R 29/0835 |
| | | | | 324/627 |
| 2005/0018371 | A1 * | 1/2005 | Mladenik | H02H 3/00 |
| | | | | 361/78 |
| 2006/0025939 | A1 * | 2/2006 | Rogovin | G01R 31/52 |
| | | | | 702/58 |
| 2024/0003985 | A1 * | 1/2024 | Wood, III | G06F 1/263 |
| 2024/0393408 | A1 * | 11/2024 | Goers | G01R 31/1272 |

FOREIGN PATENT DOCUMENTS

CN 108061839 A * 5/2018

* cited by examiner

*Primary Examiner* — Feba Pothen
(74) *Attorney, Agent, or Firm* — AlphaPatent Associates Ltd.; Daniel J. Swirsky

(57) ABSTRACT

An electrical circuit board for testing at least one cable, which comprises one or more wires, the circuit board comprising: an input connector configured to be connected to one end of the one or more wires; an output connector configured to be connected to the other end of the one or more wires; at least one processor connected via a first signal driver to the output connector; an Analog-to-Digital Converter (ADC) and a second signal driver, an SPXT (single pole, X throw) switch configured to connect the input connector to the input circuit; an oscillator circuit coupled to the at least one processor, an energy source; and wherein the at least one processor comprises a plurality of signal generation modules, which are configured to: generate and transmit at least one test signal through the end of the one or more wires of the at least one cable; receive the at least one test signal transmitted through the other ends of the one or more wires of the at least one cable; and analyze the at least one test signal using one or more signal measurement logic methods to yield data comprising intermediate test results or final test results which relate to one or more faults in the at least one cable or characteristics of the at least one cable.

26 Claims, 28 Drawing Sheets

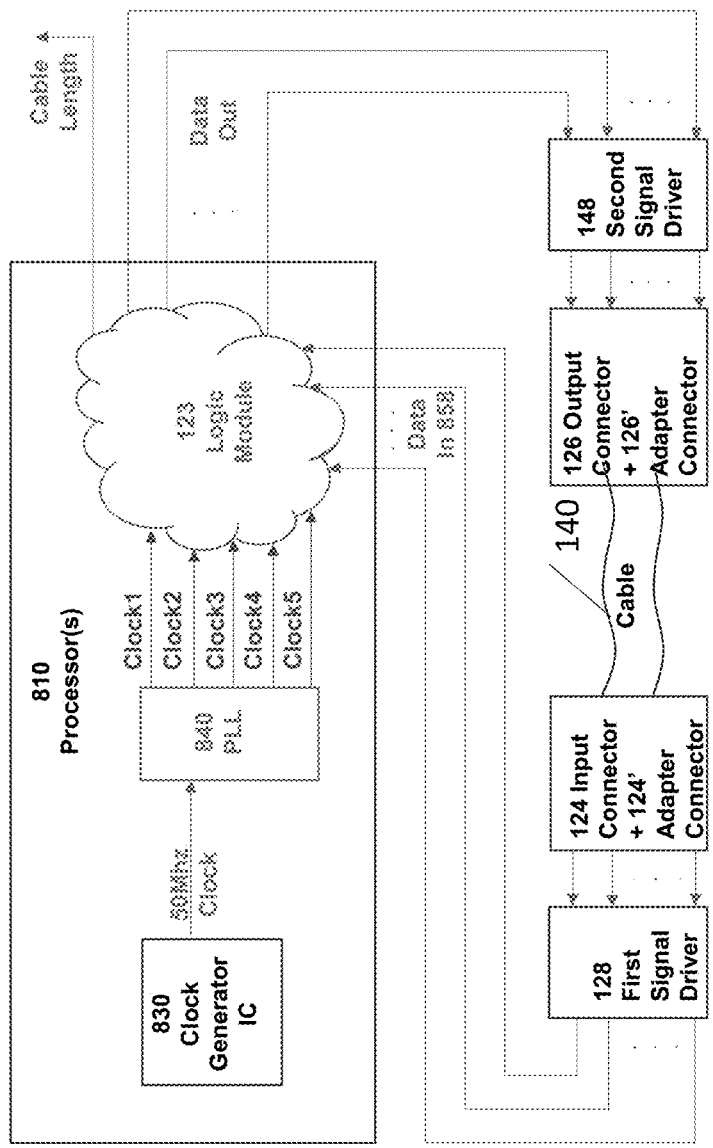

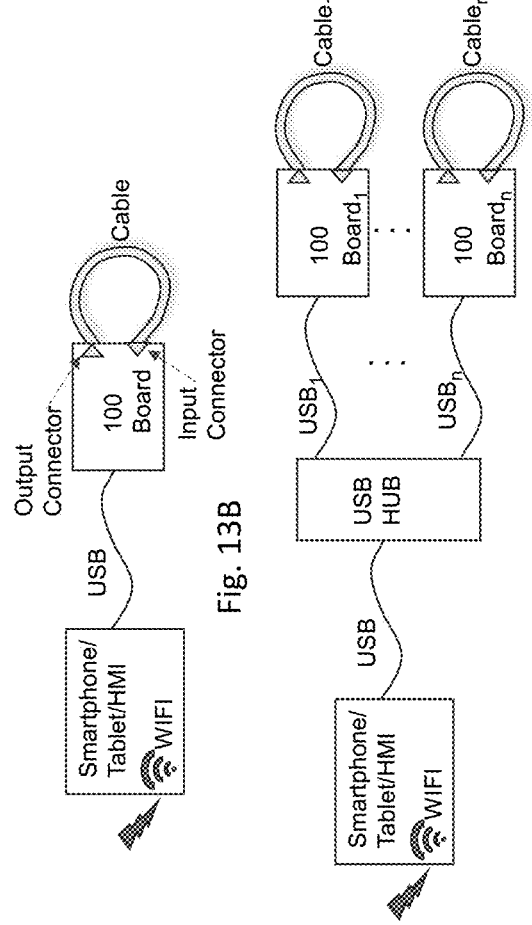

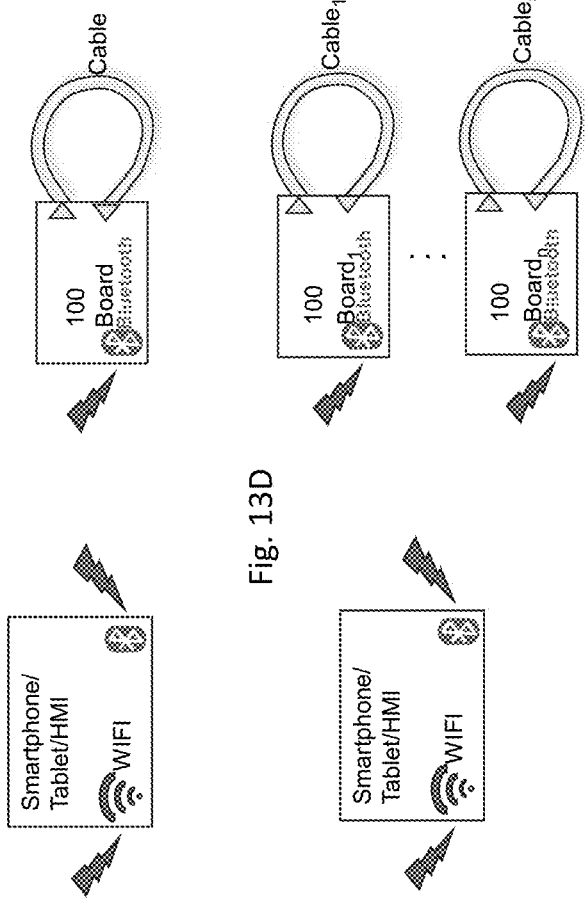

SYSTEMS DEVICES AND METHODS FOR ADVANCED CABLE TESTING

TECHNICAL FIELD

The present invention relates generally to an advanced testing board for one or more wires of cables, and more specifically, but not exclusively, to systems devices and methods for testing one or more wires of cable shorts, cut-offs, and other features using the testing board.

BACKGROUND OF THE INVENTION

Ensuring the reliability and performance of cabling infrastructure through rigorous testing methodologies is critical across industries and applications. Testing cables to identify potential issues that may affect functionality typically involves various checks such as:
Testing for shorted wires;
Testing for cut-off or severed wires;
Testing connection integrity, such as weakly connected wires, corrosion, moisture ingress or damage which may cause resistive faults;
Testing resistance of external resistors connected to the wires;
Testing capacitance of external capacitors connected to the wires;
Testing Wires length.

In addition, accurately measuring cable wire length within tight tolerances is crucial for installations, troubleshooting and adherence to wiring standards.

Conventional practices employ manual visual inspection or external computer-coupled equipment to perform such checks. However, manual inspection of cables is labor intensive while large bench testing instruments require dependency on external computing devices like personal computers (PCs), adding spatial footprint and wiring complexity.

For instance, time domain reflectometry (TDR) techniques use intricate test setups with PC-connected devices for accurate length calculations. Similarly, connectivity and continuity tests need additional test equipment and software utilities. Such approaches increase capital overheads and introduce potential inaccuracies in measurement.

CableEye® Low Voltage, Cable & Wire Harness Continuity Test Systems, offers cable continuity testers that are used to verify the integrity of electrical cables by checking for continuity, shorts, and miswires. One significant drawback of CableEye® and other solutions for cable testing is the large size of these testing devices, which reduces portability and limits their use in confined spaces or field environments. Additionally, many existing testers require connection to a personal computer for operation and data analysis, further constraining their versatility and ease of use.

There is therefore a need for quick, reliable, accurate stand-alone cable test devices and systems to address existing workflow and measurement limitations.

SUMMARY OF THE INVENTION

The invention disclosed herein provides a novel automatic testing solution for cables, offering a self-contained and comprehensive approach to cable testing without necessitating the presence of an additional PC. Notably, the innovative solution introduces a compact form factor, distinguishing it from existing competitors and alleviating concerns related to spatial constraints in manufacturing environments.

An inherent advantage of the present invention systems devices and methods lies in its ability to significantly enhance the accuracy of cable measurements such as length measurement. The incorporation of an advanced testing board facilitates a broad spectrum of cable tests, encompassing shorted wires, cut-off wires, weakly connected wires, wires resistance, wires length, wires maximum frequency and wires capacitance. This multifaceted testing capability ensures a thorough and precise evaluation of cable quality.

Moreover, the inventive solution integrates wireless communication functionalities for the transmission of commands and reception of results. This wireless feature not only alleviates the testing process but also aligns with contemporary manufacturing practices by offering enhanced connectivity options. Results from the cable tests can be efficiently communicated and, optionally, displayed through an intuitive user interface, such as the user's personal electrical device (e.g. mobile phone or smart phone).

In accordance with a first embodiment of the present invention, there is provided an electrical circuit board for testing at least one cable, wherein the at least one cable comprises one or more wires, the circuit board comprising: an input connector configured to be connected to one end of the one or more wires of the at least one cable; an output connector configured to be connected to the other end of the one or more wires of the at least one cable; at least one processor connected via a first signal driver to the output connector; an Analog-to-Digital Converter (ADC) and a second signal driver, wherein the ADC and the Second Signal Driver are each connected via separated paths at one end to the at least one processor and at the other end via separated paths to an input circuit; an SPXT (single pole, X throw) switch configured to connect the input connector to the input circuit; an oscillator circuit coupled to the at least one processor, wherein the oscillator circuit is configured to provide a clock signal to the at least one processor; an energy source configured to supply input voltage to the electrical circuit board; wherein said at least one processor comprises a plurality of signal generation modules, said plurality of signal generation modules are configured to: generate and transmit at least one test signal through the end of the one or more wires of the at least one cable; receive the at least one test signal transmitted through the other ends of the one or more wires of the at least one cable; and analyze the at least one test signal using one or more signal measurement logic methods to yield data, said data comprising intermediate test results or final test results which relate to one or more faults in said at least one cable or characteristics of the at least one cable.

In an embodiment, the faults or characteristics comprise one or more of: shorted wires; cut-off wires; weakly connected wires; Wires resistance level; Wires length; Maximum Frequency check; and Wires series capacitance check.

In an embodiment, the plurality of signal generation modules comprises: Shorted Wires Check Module, Cut Wires Check Module, Frequency Check Module, Weakly Connected Wires Check Module, Length Check Module, Resistance Check Module, Capacitance Check Module, wherein each of said plurality of signal generation modules is configured for respectively checking: shorted wires; cut-off wires; weakly connected wires; Wires resistance level; Wires length; Maximum Frequency check; and Wires series capacitance check of said one or more wires.

In an embodiment, the electrical circuit board comprising a communication interface module which is in communication with said at least one processor, wherein the communication interface module is configured to transmit the data to at least one external device.

In an embodiment, the communication interface module comprises a Universal Asynchronous Receiver/Transmitter (UART) to Bluetooth Converter or a UART to Universal Serial Bus (USB) converter for establishing a communication link between the electrical circuit board and the at least one external device.

In an embodiment, the at least one external device is selected from the group consisting of: personal computer (PC), tablet, smart phone, tablet, mobile phone, HMI.

In an embodiment, the at least one external device comprises one or more processors, wherein said one or more processors are configured to process said data to yield test results, said test results comprise the detected one or more faults or characteristics in said at least one cable.

In an embodiment, the one or more faults or characteristics are detected sequentially.

In an embodiment, the at least one external device comprises a display device and wherein the display device is configured to present information indicating the type of fault detected in the one or more cables.

In an embodiment, the at least one cable is a multi-wire cable.

In an embodiment, the oscillator circuit is a 50 MHz oscillator.

In an embodiment, the at least one processor is connected in series to the output connector via the first signal driver.

In an embodiment, the energy source comprises a primary electrical energy source configured to supply an input voltage to one or more Power Converters.

In an embodiment, the input voltage is 5V.

In an embodiment, the one or more Power Converters comprise three different power convertors configured to convert the input voltage to a plurality of output voltages suitable for the electrical circuit board.

In an embodiment, the plurality of output voltages are selected from the group consisting of: 1.2V, 2.5V, 3.3V.

In an embodiment, the energy source is connected via a Universal Serial Bus (USB) connector to the electrical circuit board.

In an embodiment, the one or more wires length is examined with an accuracy of at least 0.5 meter.

In an embodiment, the at least one processor comprises a Data packets generation and Communication module which is in communication with the Shorted Wires Check Module, Cut Wires Check Module, Frequency Check Module, Weakly Connected Wires Check Module, Length Check Module, Resistance Check Module, and a Capacitance Check Module, and wherein each of the modules is configured and enabled to respectively receive signal inputs from the tested cable via the Data Packet Generation and Communication Module and analyze, respectively, said signal inputs.

The electrical device of claim 1, wherein the test results comprise numerical results or pass or no pass results, or graphical presentations.

In an embodiment, the at least one processor is selected from the group consisting of: CPU (Central Processing Unit), DSP (Digital Signal Processor), FPGA (Field-Programmable Gate Array), ASIC (Application-Specific Integrated Circuit), MCU (Microcontroller Unit), SoC (System on Chip), NPU (Neural Processing Unit), CPLD (Complex Programmable Logic Device), MPU (Microprocessing Unit), APU (Accelerated Processing Unit).

In an embodiment, the input circuit comprises two paths, the first path comprises a resistor (R1) having a varying resistance connected in series to a circuit comprising resistor (R2) and Capacitor (C1) and the ADC and wherein the other path comprises a capacitor (C2) connected in series to the Second signal Driver.

In an embodiment, the input circuit comprises three paths, said three paths comprise two paths and an additional path, the additional path comprises a resistor R3 having a varying resistance connected in series to a circuit comprising resistor R4 and Capacitor C2 and wherein the additional path comprises capacitor C3 connected in series to the Second signal Driver and the other two paths are connected via the SPXT to the ADC.

In an embodiment, the SPXT switch is an SPDT (single pole, double throw) switch or SP3T switch.

In an embodiment, the at least one processor is configured to sequentially execute all types of cable test checks or selectively execute a subset of the cable test checks, or only one type of cable test check.

In an embodiment, the electrical circuit board comprises one or more pull-down resistors which are placed on each output of the first signal driver and the second signal driver.

In an embodiment, the one or more signal measurement logic methods comprise: method for detecting shorted wires, method for detecting one or more cut-off wires, method for detecting one or more weakly connected wires, method for resistance check, method for measuring cable length, method for measuring a maximum frequency value of a cable, and method for checking Capacitance.

BRIEF DESCRIPTION OF THE DRAWINGS

A better understanding of the features and advantages of the present disclosure will be obtained by reference to the following detailed description that sets forth illustrative embodiments, in which the principles of embodiments of the present disclosure are utilized, and the accompanying drawings.

FIG. 8A illustrates a block diagram of an electrical circuit and logic design for cable length calculation, in accordance with embodiments of the present disclosure;

FIG. 13B illustrates an example of a Point-to-Point USB configuration, in accordance with embodiments of the present disclosure;

FIG. 13C illustrates an example of a Point-to-Multipoint USB configuration, in accordance with embodiments of the present disclosure;

FIG. 13D illustrates an example of a Point-to-Point Bluetooth configuration, in accordance with embodiments of the present disclosure;

FIG. 13E illustrates an example of a Point-to-MultiPoint Bluetooth configuration, in accordance with embodiments of the present disclosure;

DETAILED DESCRIPTION OF THE INVENTION

Figure 1A:
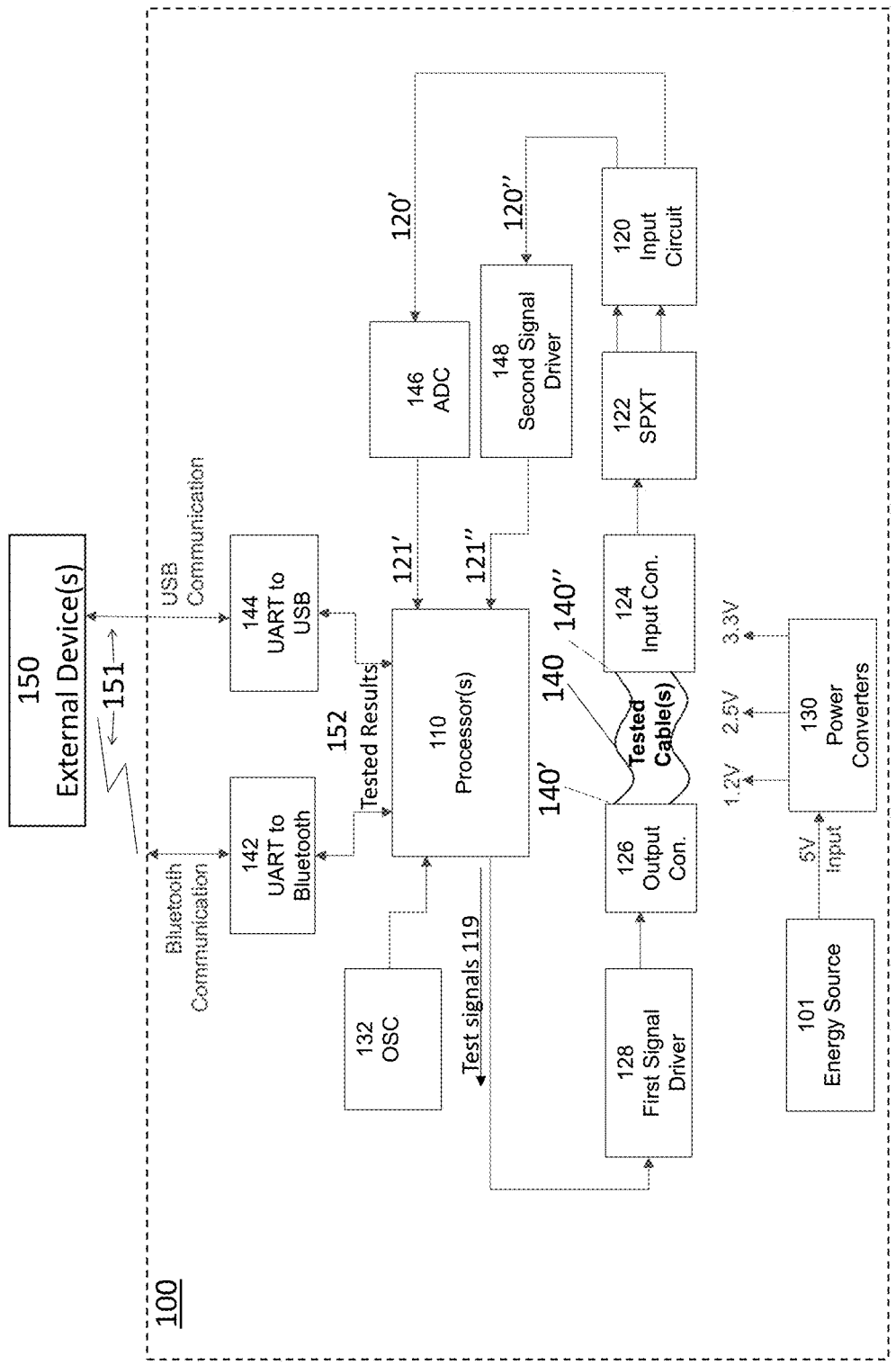
FIG. 1A illustrates a logic block diagram of electrical circuit board for cable examination, in accordance with embodiments of the present disclosure.

In the following description, various aspects of the invention will be described. For the purposes of explanation, specific details are set forth in order to provide a thorough understanding of the invention. It will be apparent to one skilled in the art that there are other embodiments of the invention that differ in details without affecting the essential nature thereof. Therefore, the invention is not limited by that which is illustrated in the figure and described in the specification, but only as indicated in the accompanying claims, with the proper scope determined only by the broadest interpretation of said claims.

The present invention relates generally to an advanced testing device, such as an electrical circuit board, for the assessment/testing of one or more cables. The invention specifically focuses on detecting of one or more faults in the cables and/or determining cable characteristics such as shorts, cut-offs, and various other features within the cable structure. The present invention provides a precise and comprehensive evaluation of cable integrity, ensuring optimal functionality and reliability in diverse applications.

In some cases, the cable is a multi-wire cable.

A multi-wire cable, as described herein, refers to an electrical cable comprising multiple wires such as conductive wires enclosed in some cases within a common insulating sheath. Each wire, in according with embodiments, may include multiple fibers.

In accordance with embodiments, the cable (e.g. multi-wire cable) comprises a plurality of wires, each wire further comprising a plurality of fibers.

In some cases, each conductive wire within the cable is typically insulated individually to prevent electrical contact with adjacent wires. The fibers may be arranged in parallel, twisted, or bundled configurations within the wire to achieve the desired performance characteristics. The multi-wire cable is designed to carry electrical signals or power, and in some embodiments may include additional components such as shielding, fillers, and protective outer jackets to enhance its performance and durability. This type of cable is commonly used in various applications, including telecommunications, data transmission, and power distribution.

In accordance with embodiments, there are provided systems, devices, and methods comprising one or more testing boards, such as electrical circuit boards, and one or more processors configured and enabled to test cables for one or more cable defects or faults, such as shorted wires, cut-off wires, weakly connected wires, wire resistance, wire length, wire capacitance, and the like, and further provide test results.

In some embodiments, the test results may be transmitted wirelessly, for example, via Bluetooth communication, or by a wired connection, for example via USB connection to a local or one or more external devices for further processing and/or displaying the test results.

Advantageously, the system, devices, and methods include improved cable testing equipment size.

Additionally, the system, devices, and method include cable length measurement accuracy.

One or more components of the configurations disclosed herein can be combined with each other in many ways.

As used herein, like characters refer to like elements.

Referring now to the drawings, FIG. 1A illustrates a logic block diagram of electrical circuit board 100 for cable testing, in accordance with embodiments. The arrow connectors illustrated in FIG. 1A, which interconnect one electrical element to another, represent logical data transmission from one element to the other element on the electrical circuit board 100, in accordance with embodiments.

In some embodiments, the testing electrical circuit board 100 may be part of cables quality testing equipment. In accordance with one embodiment, the electrical circuit board 100 comprises one or more Power Converters 130, Input connector 124, Output connector 126, one or more Signal Drivers for driving one or more test signals 119 from the beginning 140' of at least one cable 140 to its other end 140". For example, the electrical circuit board 100 may comprise two or more signal drivers, such as two drivers: First Signal Driver 128 and Second Signal Driver 148. The electrical circuit board 100 further comprises an Analog to Digital Converter (ADC) 146 for converting the one or more test signals 119 from analog values to digital numbers on the other cable end 140", SPXT 122 such as SPDT (Single pole, double throw) or SP3T, Input Circuit 120, an Oscillator (OSC) 132 such as a 50 Mhz oscillator, and at least one processor 110. The at least one processor 110 is configured and enabled to generate and receive one or more test signals 119, process the test signal (as illustrated in modules 111-118 shown in FIG. 1C), and perform calculations based on one or more signal measurement logic methods and using the at least one processor's 110 logic module 123 to yield data comprising the identification of one or more cable defects and/or faults such as shorted wires, cut-off wires, weakly connected wires, wire resistance, wire length, wire capacitance, and the like, and provide (e.g. display) test results including the identified defects/faults and/or characteristics of the one or more cables.

In accordance with embodiments, the frequency of OSC 132 can be in the range from 0.1 MHz to 1 GHz.

In accordance with embodiments, the at least one processor 100 may be or may include one or more of: CPU (Central Processing Unit), DSP (Digital Signal Processor), FPGA (Field-Programmable Gate Array), ASIC (Application-Specific Integrated Circuit), MCU (Microcontroller Unit), SoC (System on Chip), NPU (Neural Processing Unit)—for AI-related tasks, CPLD (Complex Programmable Logic Device), MPU (Microprocessing Unit), APU (Accelerated Processing Unit).

In accordance with embodiments, the test results may include numerical results and/or pass/no pass results. In another embodiment, the test results can include graphical lines presentation which shows which pins of the cable were identified as connected to which pins. For example, a presentation showing pin one of a cable such as cable 140 connected to pins two and three of the cable.

The test results can also include success or failure signs, for example, V and X for success or failure.

In accordance with embodiments, the cable testing checks are provided for example in several seconds, for example in less than 3, 2, or 1 seconds.

The electrical circuit board 100 further comprises, a Universal Asynchronous Receiver/Transmitter (UART) to Bluetooth Converter 142, and/or a UART to USB converter 144.

In accordance with embodiments, a primary electrical energy source 101 supplies an input voltage, for example 5V, to Power Converters 130. The Power Converters 130 comprise for example three different power convertors which may convert the input voltage to a plurality of output voltages suitable for the electrical circuit board 100, such as 1.2V, 2.5V, and 3.3V. It should be stressed that other voltage levels may be selected or used according to the type of the used electrical elements, for example embodiments including other types of FPGA may include using other various voltages.

In one embodiment, the Power Converters 130 may include or may be connected to a USB connector, such as a 5V USB connector, for connecting the electrical circuit board 100 to the Energy source 101 and receiving a 5V input voltage. The Power Converters 130 distribute various derived voltages to the electrical components on the board 100. Each component on the board 100 may utilize some or all of these derived voltages, such as 1.2V, 2.5V, and 3.3V. For example, the at least one processor 110 may utilize all the voltage types, while other electrical components may only require the 3.3V supply.

In one embodiment the Power Convertors 130 may be connected to the at least one processor 110 for continually supplying the various type of Voltages to the at least one processor 110, while other electrical elements in the circuit board 100 such as the ADC 146 receives, for example, only a 3.3V.

Figure 2A:
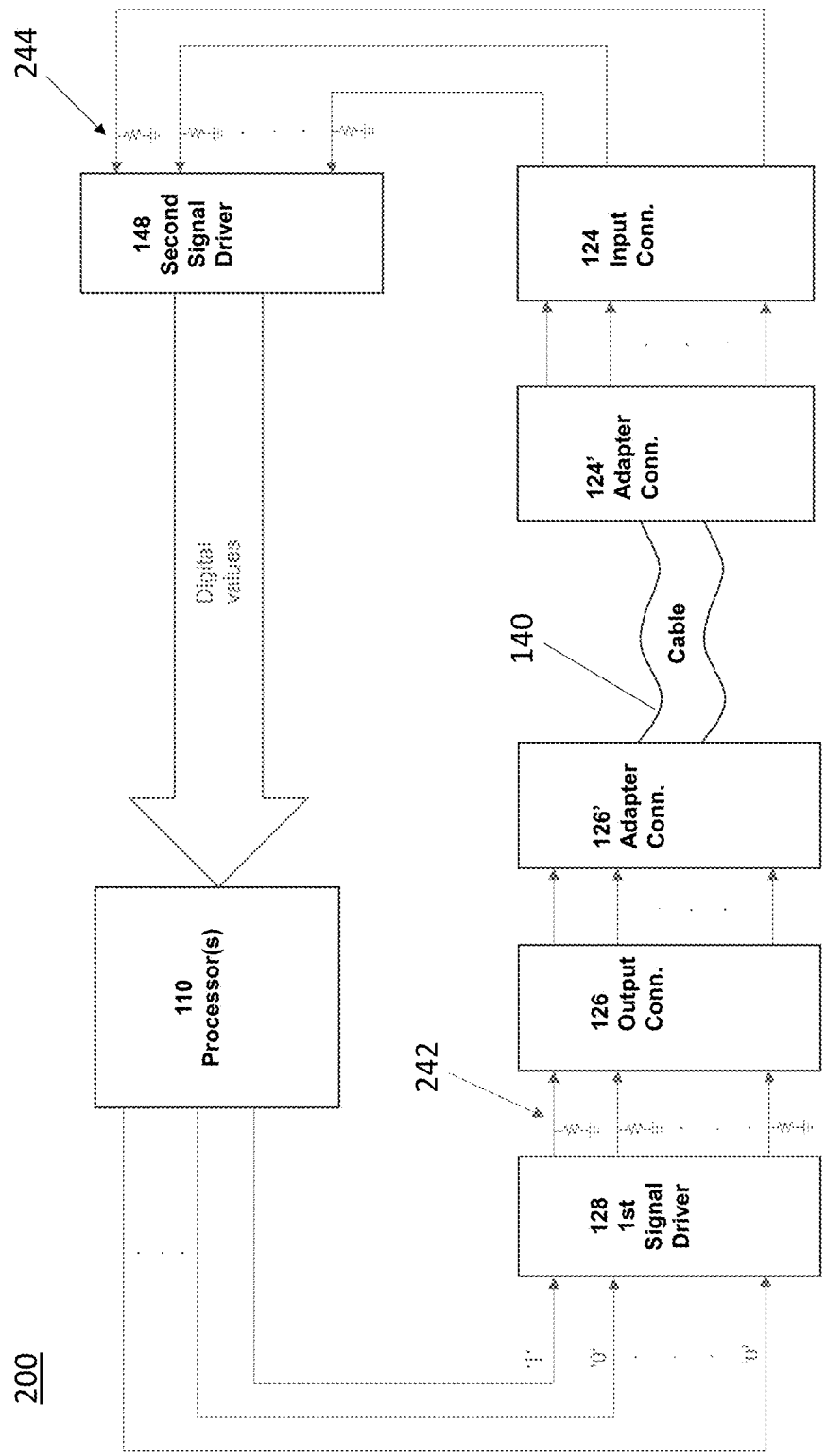
FIG. 2A and FIG. 2B illustrate a logic block diagram of circuit board and a respective flow chart showing a method for detecting shorted wires in a cable, in accordance with embodiments of the present disclosure.

One or more cables, such as at least one cable 140, are connected between the Output Connector 126 and the Input Connector 124, optionally through one or more adapters/ terminals such as Adapter Connector 126' and Adapter Connector 124' (shown in FIG. 2A). For example, for one or more cables including thirty wires there are provided, respectively, thirty input and output terminals for connecting each wire of the cable. The Input Connector 124 is connected to a switch such as SPXT switch 122, which comprises X paths (e.g. single-pole double-throw (SPDT)/ SP3T), which is connected via two or more paths such as two path connectors to an Input Circuit 120. Input Circuit 120 is further connected through the 2nd Signal Driver 148 and the analog-to-digital converter (ADC) 146 to the at least one processor 110. The at least one processor 110 is connected, for example, in series through the First Signal Driver 128 and the Output Circuit 126 to the other edge of the at least one cable 140.

According to one embodiment, an oscillator circuit 132, such as a 50 MHz oscillator, for providing a clock signal to the at least one processor 110. For example, in one embodiment the oscillator circuit 132 is directly connected the to the at least one processor 110. Furthermore, according to one embodiment, the circuit board 100 may be communicatively coupled to one or more external devices 150 such as computing devices, for example a personal computer, tablet, smart phone, Human-Machine Interface (HMI) or the like, which runs an application which communicates with the circuit board 100. For example, the circuit board 100 may comprise communication interfaces such as a UART to Bluetooth converter 142 and/or a UART to USB (Universal Serial Bus) converter 144 for establishing a communication link 151 between the electrical circuit board 100 and the external devices 150. Through these interfaces, the circuit board 100 receives instructions including which type of test to perform to detect faults or characteristics of the at least one cable 140 and transmits data including test results related to cable testing procedures, such as the test results as respectively calculated by modules 111-117 and transmitted by module 118. In some instances, only one of the two interfaces, either the Bluetooth interface or the USB interface, will be utilized for facilitating communication with the electrical circuit board 100. In one embodiment, the electrical circuit board 100 and the external device(s) 150 can be included in the same device or system or separated in different devices.

In accordance with embodiment, the external device(s) 150 may comprise a communication port such as a WIFI port for communicating and transmitting/receiving data including for example the cable's 140 test results, to private/public local and external internet sites.

In accordance with embodiment, the First Signal Driver 128 is configured to transmit the one or more test signals 119 from the Output connector 126 of the at least one cable 140 to the input connector 124 thereof. The one or more test signals 119 may include, for example, in case of a shortened wire check, logic '1' for one of the wires and logic '0' for the other wires in the at least one cable 140. The at least one test signal 119 propagates from the output connector of the at least one cable 140 to the SPXT 122, and subsequently from the SPXT 122, for example, in two output signal paths to the Input Circuit block 120. The Input Circuit block 120 comprises, for example, two input signal paths 120" and 120'. The at least one processor 110 is configured and enabled to selectively enable one of the two input/output signal paths 120' and 120" of the Input Circuit block 120 to output the at least one test signal 119 received from the SPXT 122.

A first path 120' continues to the ADC 146 which outputs data 121' which includes digital numbers which are the digital conversion of the analog inputs signal 120' to the ADC 146. The second path 120" continues to the second signal driver 148 which is configured and enabled to receive the at least one test signal 119 from input circuit 120 and strengthen the at least one test signal 119 and output one or more strengthened test signals 121". This is done in order to increase the test signal voltage that was attenuated through the at least one cable 140, in case it is a long cable.

Respectively, the Oscillator 132 supplies frequency, for example 50 Mhz frequency, to the at least one processor 110 for synchronizing processes inside the at least one processor 110.

In accordance with embodiments, the at least one processor 110 is configured and enabled to receive the one or more test signals 119 and perform calculations using one or more signal measurement logic methods, as will be explained in detail below (e.g. flow charts 210, 300, 400 etc.) for measuring and providing the results of one or more of the following features for the at least one cable 140:
1. Checking for shorted wires;
2. Checking for cut-off wires;
3. Checking for weakly connected wires;
4. Checking for Wires resistance;
5. Checking for Wires length with accuracy in the range of at least +/−0.5 m;
6. Checking for frequency such a maximum frequency of the wires;
7. Checking for Wires series capacitance.

In accordance with one embodiment, the at least one cable 140 testing for: '4. Wires Resistance' and '7. Wires series Capacitance', are checked via path 120' that leads to the ADC 146. All other cables' 140 testing features, including: '1. Checking for shorted wires'; '2. Checking for cut-off wires'; '3. Checking for weakly connected wires'; '5. Checking for Wires length with accuracy of at least +/−0.5 m; and '6. Checking for Frequency such as the maximum frequency of the wires', are checked using path 120" that leads from the Input Circuit 120 to the second signal driver 148.

It should be stressed that, in accordance with embodiments, the ADC 146 comprises one or more internal resistors connected, for example, in series to a very small internal capacitor (e.g. 220 pF-680 pF). Because of the small value of the capacitor, the internal resistor and capacitor may be neglected in the calculations presented in the present invention.

Figure 1B:
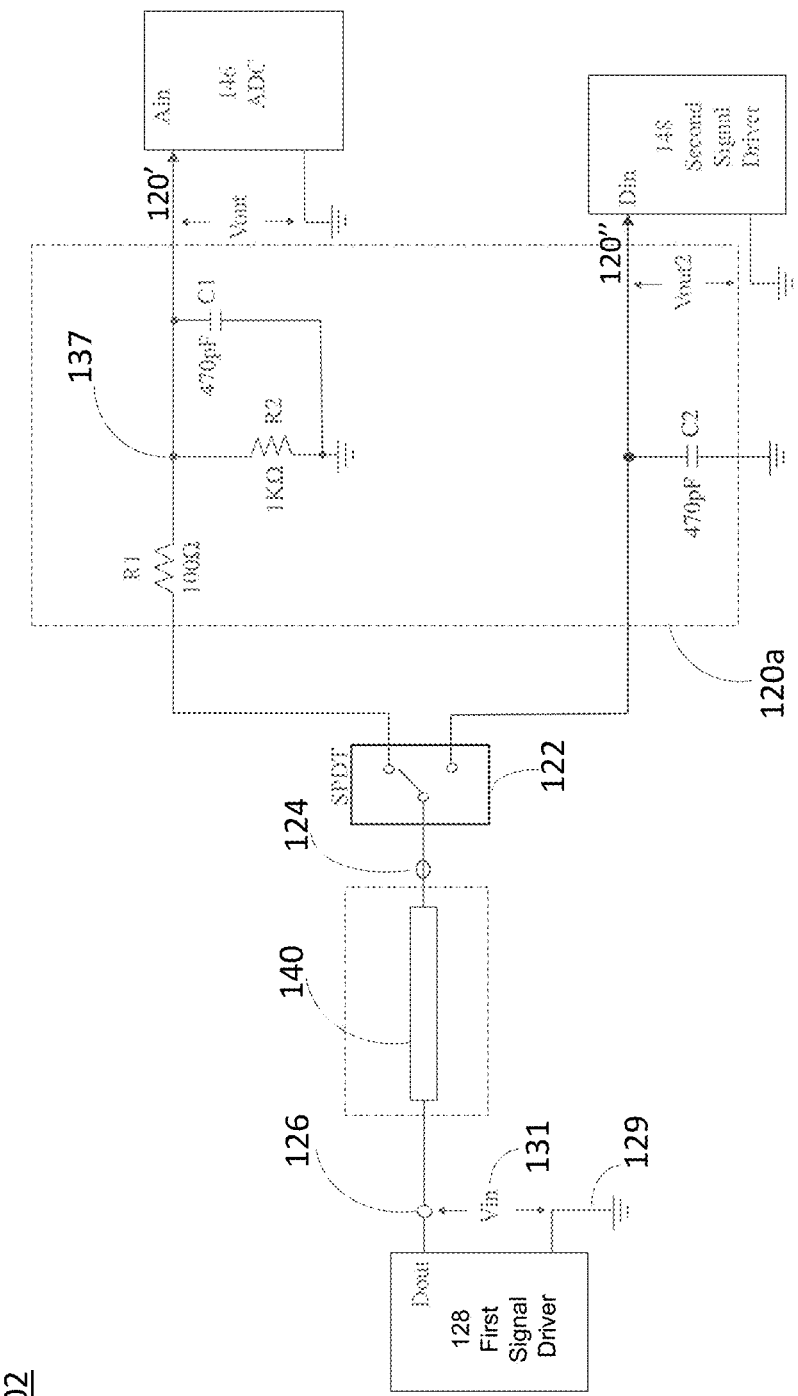
FIG. 1B illustrates a detailed block diagram of an Input Circuit, in accordance with embodiments of the present disclosure.

FIG. 1B illustrates a detailed block diagram of a circuit board 102 comprising an example of Input Circuit 120a implementation of Input Circuit 120 shown in FIG. 1A which comprises two paths used for cable testing, in accordance with embodiments. More specifically, the electrical components shown in FIG. 1B represent a detailed electrical block diagram of the bottom portion of FIG. 1A.

The First Signal Driver 128 supplies an input voltage $V_{in}$ 131 to the at least one cable 140 in the output connection 126, measured relative to a local (chassis) ground 129. The at least one cable 140 is further connected in input connection 124 to the SPXT 122 (e.g. SPDT) for switching, for example, between two paths. The first path comprises a resistor R1 having a varying resistance of for example of 100Ω connected in series in point 137 to a circuit comprising resistor R2 and Capacitor C1 and ADC. The other path comprises capacitor C2 having for example 470 pF and connected in series to the Second signal Driver.

Figure 1C:
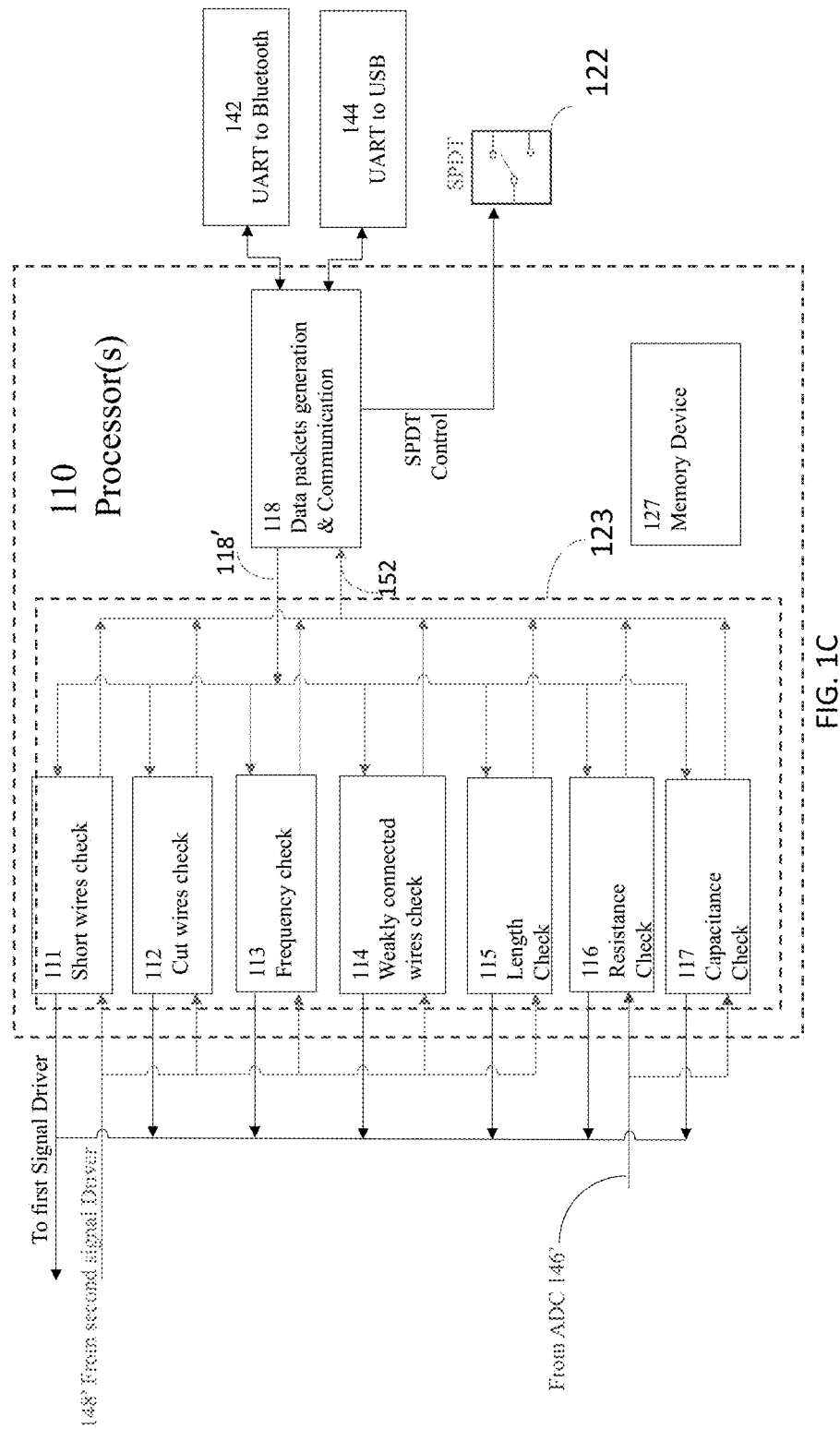
FIG. 1C illustrates a high-level block diagram of the at least one processor shown in FIG. 1A, in accordance with embodiments of the present disclosure.

FIG. 1C illustrates a detailed block diagram of the at least one processor 110 shown in FIG. 1A, in accordance with embodiments. The at least one processor 110 comprises a logic module 123 comprising signal generation modules, such as seven different signal generation modules 111-117, wherein each of the seven modules 111-117 is configured and enabled to respectively generate and transmit the one or more tested signals 119 for checking and/or testing cables, such as the at least one cable 140, for one or more cable defects or faults, such as shorted wires, cut-off wires, weakly connected wires, wire resistance, wire length, wire capacitance, and the like, and provide test results. Specifically, in accordance with embodiments, the at least one processor 110 comprises Shorted Wires Check Module 111, Cut Wires Check Module 112, Frequency Check Module 113, Weakly Connected Wires Check Module 114, Length Check Module 115, Resistance Check Module 116, and Capacitance Check Module 117 which are configured and enabled to send the test results to a Data packets generation & Communication module 118. Each of the modules 111-117 is configured and enabled to respectively receive the one or more test signals 119 inputs from the at least one cable 140. Data Packets Generation & Communication Module 118 collects test results from modules 111-117 and for example converts them to data packets which are transmitted out of the at least one processor 110 to UART to Bluetooth converter device 142 and/or to UART to USB converter device 144.

In accordance with embodiments, the modules 111-117 perform measurement test processes to respectively detect cable defects in the at least one cable 140. The detection process may, for example, comprise sequentially executing all seven types of cable test checks or selectively executing a subset of the cable test checks, or only one type of cable test check.

In accordance with embodiments of the present invention, the at least one processor comprises one or more memory devices, such as memory device 127 operatively coupled thereto. The one or more memory devices may include, but are not limited to, random access memory (RAM), read-only memory (ROM), flash memory, or any other suitable type of memory device. In some embodiments, the one or more memory devices may be integrated within the processor, while in other embodiments, the one or more memory devices may be external to the processor and communicatively coupled thereto. The one or more memory devices are configured to store instructions executable by the processor, as well as data processed by or to be processed by the processor. Such data may include, but is not limited to, test parameters, intermediate test results, final test results, and historical data from previous testing operations. The processor, in conjunction with the one or more memory devices, is configured to execute the stored instructions to perform the various testing and analysis operations described herein.

In operation, each of the at least one processor's modules 111-117 receive a Start Command 118' from the Data packets generation & Communication module 118, to start measuring the received test signals. Specifically, the 'Start' command 118' is sent, for example, by the external device(s) 150 to the Data packets generation & Communication Module 118.

Additionally, each one or some of the seven modules 111-117 receive an input test signal 148' from the second signal driver 148 or an input signal 146' from the ADC 146. These input signals are further analyzed and processed accordingly and respectively by the corresponding modules 111-117 to yield cable test results 152. Thereafter, the respective cable test results are sent via the UART to Bluetooth converter 142 or to UART to USB converter 144 to one or more external devices 150 such as a personal computer, a mobile device such as a smart phone and/or tablet computer or the like.

The one or more external devices 150 comprise one or more processors for receiving the cable test results 152. In the external devices 150 the test results 152 are presented (e.g. on a display), for example graphically or numerically. In some cases, part of the seven test results (111-117), such as capacitance 117 and resistance 116 are converted from digital voltage values to resistance and capacitance values at the external devices 150. The reason for that is to perform the simple calculations in the at least one processor 110 and the rest of the calculations which are more complexed, in the processors of the external devices 150, since in many cases the processors in the external devices are more suitable for complexed calculations.

Figure 2B:
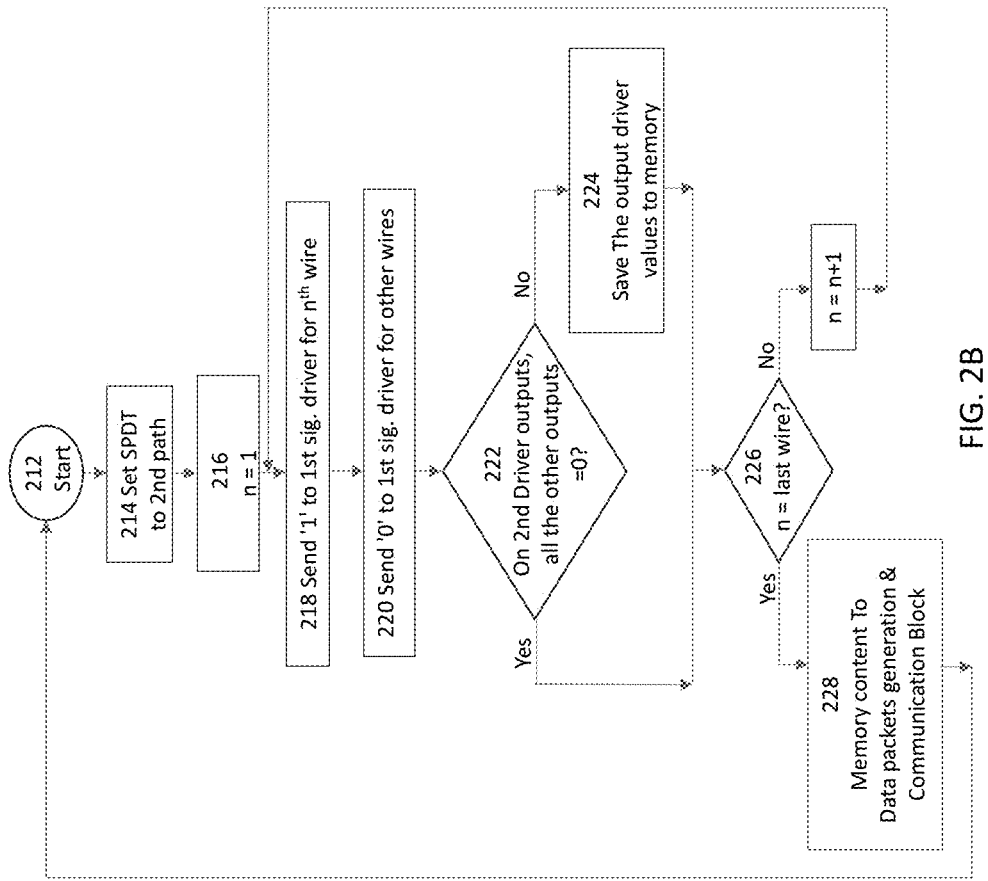

FIG. 2A and FIG. 2B illustrate a logic block diagram of circuit board 200 and a respective flow chart 210 showing a method for detecting shorted wires in a cable using circuit 200, in accordance with embodiments.

In accordance with embodiments, by selectively setting one wire high (e.g. digital logic '1') in the cable and the rest low (e.g. digital '0'), the at least one processor 110 can test that individual wire for potential short circuits with the other wires in an iterative process through the whole cable.

For example, let's suppose we have four wires in the tested cable 140. The at least one processor 110 sends '1' through the first wire. So, binarily it will look: 1000 before the first signal driver. In case that the first wire is shorted to the fourth wire, binarily it will look 1001 immediately after the first signal driver and till after the second signal driver and to the at least one processor 110.

In the next iteration, only the second wire will be set by the at least one processor to '1' and all the other wires will be set to '0'. It is stressed that the signal drivers will be signal drivers with output driven to high-z in case the corresponding input is set to '0'.

It should be emphasized that the logic block diagram of circuit board 200 is included as part of the block diagram of circuit board 100, and the selected blocks in circuit board 200 are illustrated for simplicity, and in some embodiments additional elements may be included in circuit board 200.

As for flowchart 210, at step 212 the testing process performed by module 111 for short wires check starts by receiving a command at the at least one processor 110, for example initiated by the user's device which is in communication with circuit board 200.

At step 214 the SPXT switch 122 (SPDT) is set to the second path 120" for connecting the Input Circuit 120 via the Second Signal Driver 148 to the at least one processor 110 as shown in FIG. 1A and respectively in FIG. 2A.

At step 216, the at least one processor 110 initiates the variable n which holds the tested wire number to 1, which means: first wire testing and at step 218 one single wire (e.g. the first wire n=1) from the multiple wires of the at least one cable 140 is set to a logic high state or digital logic '1' and accordingly the at least one processor 110 sends digital logic '1' to the first signal driver for $n^{th}$ wire, while at step 220 all the other wires of at least one cable 140 are concurrently set to a logic low state or digital '0', and accordingly the at least one processor 110 sends low state or digital '0' to the first signal driver for these other wires in the cable.

In accordance with embodiments as illustrated in FIG. 2A the outputs of the 1st signal driver 128 which their inputs are set to '0' will be put by the at least one processor 110 in tri-state mode. This tri-state output configuration effectively disables the output drivers from actively driving their respective output lines, allowing these lines to be controlled or driven by other output drivers within the at least one processor 110 or by external components connected to the same lines. Accordingly, pull-down resistors 242 which are placed on each output of the 1st signal driver 128 will pull the tri-stated outputs to '0'. In other words, the resistors 242 will cause digital logic '1' output to fall to '0' (e.g. if the logic high state is 3.3V it will fall to '0'), and the other '0' outputs will be floating (e.g. the $1^{st}$ signal driver is disconnected from the outputs), hence disconnected signals are transmitted to the '0' outputs from the resisters (and not from the $1^{st}$ signal driver).

In case one of the wires is shorted to the first wire through which a logic 1 is transmitted, then that resistor, will receive a logic 1 on the side that is shorted. This means it will get the logic 1 from the above wire, resulting in at least two logic 1 signals received at the $2^{nd}$ driver 148 (and in the at least one processor 110) and the rest zeros. In case that the number of the wires in the tested cable is less than the number of the inputs of the second signal driver, then the non-connected inputs should have a known logic state. This is done, in accordance with embodiments, by the pull down resistors (near the second signal driver) which pull these unconnected inputs to logic '0'.

At step 222 a conditional statement for checking the output received at the $2^{nd}$ Driver 148. In case, 'yes' and all the logic '0' values and the single logic '1' for all wires will be transferred by the 2nd signal driver 148 back to the at least one processor 110. This 'yes' result which contains a single '1' and all the rest '0' means that the cable doesn't have shorted wires. In case 'no' and that another wire, or several wires, are shorted to the wire which is set to '1' then all the shorted wires will be set to '1'. All the shorted wires will overcome the pull-down resistors and transfer '1' values to the 2nd signal driver 148. This 'no' result which contains several '1' values means that the cable is faulty and at step 224 the at least one processor receives all the '1' values positions and the from the second output driver 148. All or some of these positions may be saved for example to a memory, such as memory 127. Steps 218-222 are repeated at condition step 226 for all wires and in the next iteration, a second wire in the at least one cable 140 will be set to logic '1' and all the other wires will be set to '0'. These iterations will continue until each wire n in his turn will be set to '1' separately. When all the iterations are finished, hence once n=last wire=yes, then at step 228 the memory content including the results are transmitted to the Data packets generation & Communication 118. The results include for example which one or more wires of the cable wires is shorted.

In accordance with embodiments, the method 210 of FIG. 2B is initiated and managed by the logic module 123 inside the at least one processor 110. The start command 212 may be initiated by external devices 150 and sent to the at least one processor at step 212 of method 210.

It should be stressed that high state or digital logic 1 may be defined as transmission of more than 0.7 VCC, while logic '0' may be defined as transmission of less than 0.3 VCC. If VCC=3.3V then the voltages values will be 2.3V and 1V accordingly.

Figure 3:
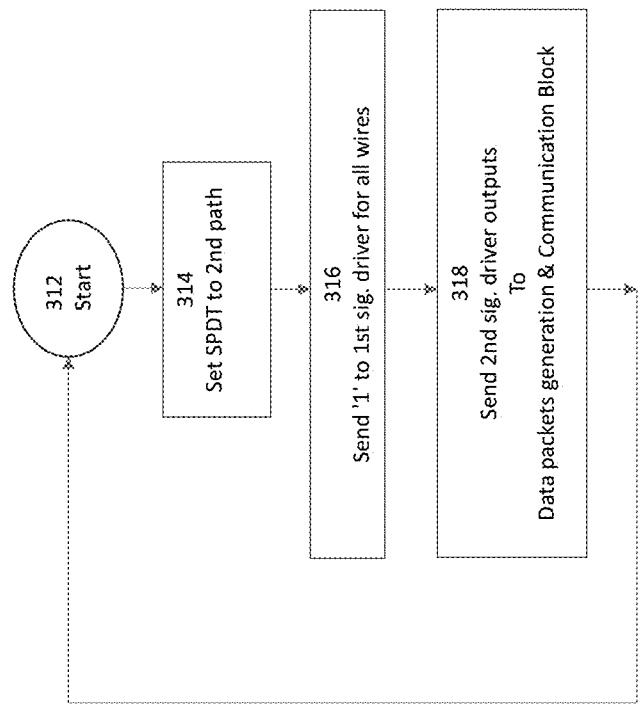
FIG. 3 illustrates a flow chart showing a method for detecting one or more cut-off wires in a cable using circuit board such as the electrical circuit board, in accordance with embodiments of the present disclosure.

FIG. 3 illustrates a flow chart 300 showing a method for detecting one or more cut-off wires in a cable, in accordance with embodiments.

In accordance with an embodiment, circuit board 100 of FIG. 1A and the at least one processor 110 of FIGS. 1A-1C may be used to perform the method for detecting one or more cut-off wires in a cable.

At step 312 the testing process performed by module 112 for cut wires check starts by receiving a command at the at least one processor 110, for example a command initiated by the external devices 150 which is in communication with circuit board 100.

At step 314 the SPXT switch 122 is set to the second path 120" for connecting the Input Circuit 120 via the Second Signal Driver 148 to the at least one processor 110 as shown in FIG. 1A and respectively in FIG. 2A. At step 316 a logic '1' is set and sent to the First Signal driver 128 by the at least one processor 110 for all wires of the at least one tested cable 140.

At step 318 the outputs of the second signal driver 148 are transmitted to the data packet generation & communication block 118. Wires which are sampled with logic '0' are indicated as cut-off wires. Hence, if indeed there is cut-off in one of the wires in the cable 140 one of the transmitted logic '1' would not be received at the second signal driver. For example, in the event of a discontinuity, such as a cut-off, occurring in the terminal wire of a multi-wire cable, such as at least one cable 140 comprising ten wires, the logic level '1' signal transmitted from the First Signal driver 128 to all wires of said at least one cable 140 will be prevented from propagating through the severed terminal tenth wire. Consequently, the pull-down resistors 244 will force said terminal tenth wire to a logic level '0' state. The resulting combination of logic level '1' signals on the uninterrupted wires and the logic level '0' on the severed terminal tenth wire is conveyed to the data packet generation & communication block 118. The discontinuity status of the terminal tenth wire is thereby encoded within the data packet and communicated to the user's device processor (e.g. external device 150) such as a smartphone, via a Bluetooth or USB connection for presentation to the user. The user's device processor will decode the status and for example, display to the user 'wire #10—separated'.

As mentioned above and as illustrated in FIG. 2A all the values pass on the path which goes through the 1st signal driver and the 2nd signal driver. The process 300 is initiated and managed by a logic inside the at least one processor 110, using for example the cut wires check module 112, in accordance with embodiments.

Figure 4:
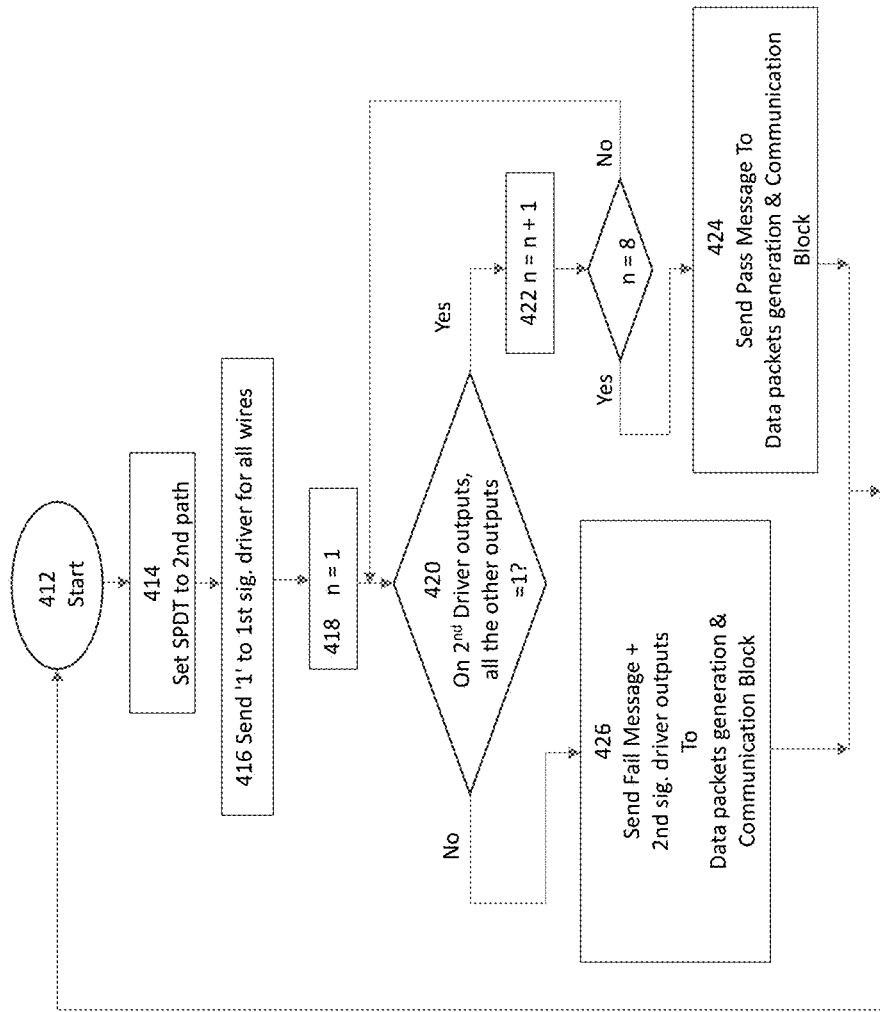
FIG. 4 illustrates a detailed flow chart showing a method for detecting one or more weakly connected wires of a cable, for cases where one or more wires in the cable are intermittently connected and then disconnected, in accordance with embodiments of the present disclosure.

FIG. 4 illustrates a flow chart 400 showing a method for detecting one or more weakly connected wires of a cable, using a circuit board such as circuit board 100, for cases where one or more wires in the at least one cable 140 are intermittently connected and then disconnected, in accordance with embodiments.

In this case, the method is performed based on method 300 for checking cut off wires and as specifically illustrated in FIG. 3. This type of weakly connected wires are wires which are sampled as logic '1' in one sample and as logic '0' in another sample. These types of weakly connected wires are a result of bad and weak connections. Therefore, each one of the wires is checked several times to identify such wires which are weakly connected.

At step 412 the testing process, performed for example by module 114 for weakly concocted check, starts by receiving a command at the at least one processor 110, for example a command initiated by the external device 150 which is in communication with circuit board 200.

At step 414 the SPXT switch 122 (e.g. SPDT) is set to the second path 120" for connecting the Input Circuit 120 via the Second Signal Driver 148 to the at least one processor 110 as shown in FIG. 1A and respectively in FIG. 2A. At step 416 a logic '1' is set and sent to the First Signal driver by the at least one processor 110 for all wires of cable 140.

At step 418, the at least one processor 110 sets the logic states of the wires in the cable and one single wire (e.g. the first wire n=1) from the multiple wires of the tested cable 140 is set to a logic high state or digital logic '1' and accordingly the at least one processor 110 sends digital logic '1' to the first signal driver 128 for all wires. At step 420 conditional statement for checking the output received at the 2nd Driver 148 is performed. In case, 'yes' and all the logic '1' values for all wires are equal to '1' then at step 422 the counter n advances by 1. This counter is used to repeat the process 8 times. If for 8 times the condition 420 results yes then at step 424 a 'pass' message that the cable is in order is sent to the Data packets generation & Communication module 118. In case 'no' for one of the 8 iterations and on 2nd Driver 148 outputs not all the outputs are equal to 1 than at step 426 a 'Fail' message and the 2nd sig. driver outputs are sent to the Data packets generation & Communication module 118.

Figure 5A:
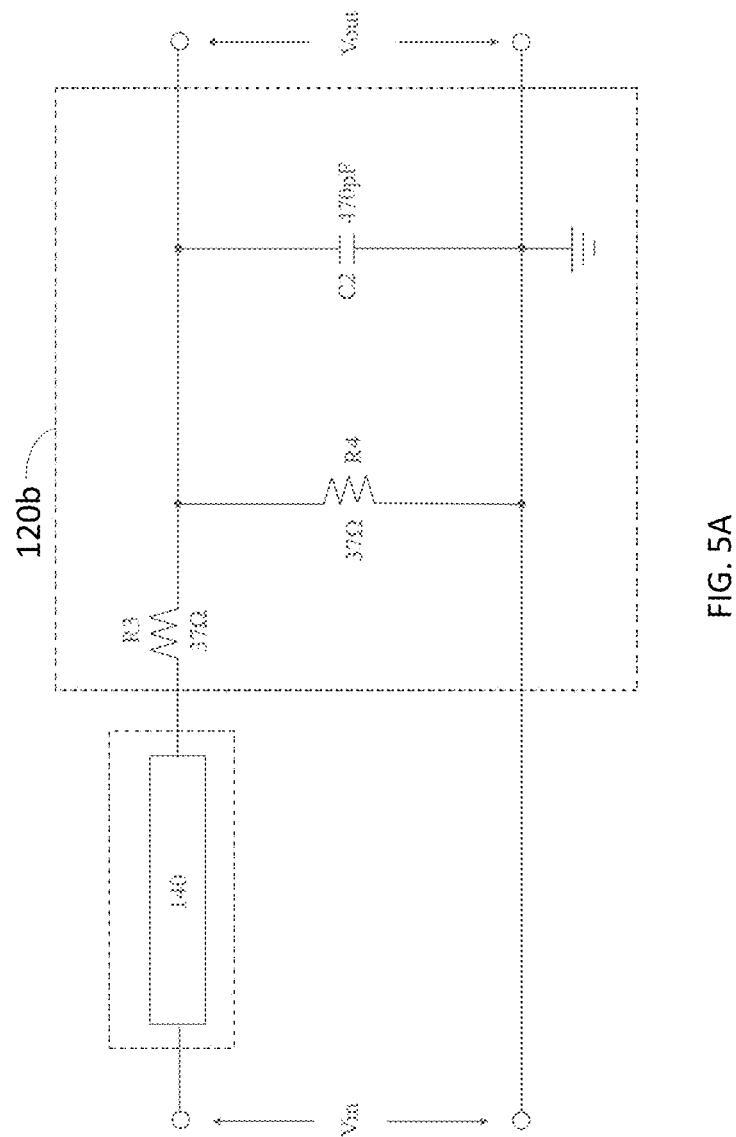
FIG. 5A illustrates an input electric circuit for detecting one or more weakly connected wires of a cable and specifically for bad crimping identification, in accordance with embodiments of the present disclosure.
Figure 5B:
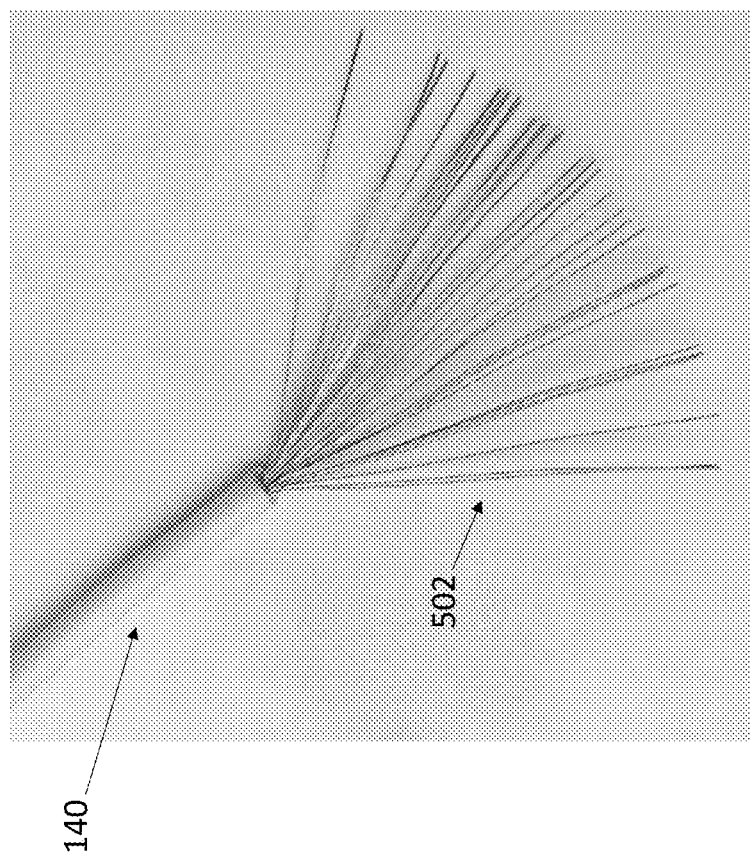
FIG. 5B shows an example of multi-fiber wire, in accordance with embodiments of the present disclosure.

FIG. 5A illustrates an example of a circuit board 500 including input circuit 120b (implementation of Input Circuit 120 shown in FIG. 1A) for detecting one or more weakly connected wires of a cable and specifically for bad crimping identification depicting in case the wire exhibits a weak connection as a result of partial wire termination, whereby only a small fraction (e.g. Less than 30%) of the total number of conductive strands or fibers of the wire, such as the wires 502 of a multi-wire cable 501 shown in FIG. 5B are crimped or terminated into the connector pin, in accordance with some embodiments. In accordance with other embodiments resistors R3 and R4 of circuit 120b can have other values as well. However, the sum of resistors R3 and R4 should not be too small to cause over-current consumption by the first signal driver 128. Such an over-current consumption will damage the first signal driver 128.

The method is based on the fact that the resistance of a partially crimped wire is higher than in the case that all the wire fibers are crimped. For example, in the case of a wire comprising 40 fibers, if the wire total resistance is 0.1Ω, then if only 4 fibers will be crimped then the wire resistance will be 1Ω.

In accordance with embodiments, circuit board 500 comprises input circuit 120b comprising two serial resistors R3 and R4 connected to the at least one cable 140 and a capacitor C2 parallelly connected to resistor R4. Because the cable's wires resistance is of the size of 0.01Ω to 1Ω, the serial resistor connected to the cable should be small, but not too small, so that the signal driver (e.g. first signal driver 128) will be able to drive the signal. (in the circuit, for example two 37Ω resistor R4 and R3 connected in series are chosen). A strong signal driver can drive 50 mA. Because of the high ratio between the cable's resistance and the two 37Ω resistors, a high-resolution ADC 146 (16-bit resolution for example) is used.

In an embodiment, circuit 500 comprises:
Vin is the input power which is outputted by the signal driver (e.g. second signal driver 148) of the electrical circuit board 100.
Vout is the sampled power by the ADC of the electrical circuit board.
I is the current that flows through the circuit.
Assumption: C2 which is used to restrain noise and signal overshoot is negligible for the following equations, since the 470 pF capacitance of C1 capacitor causes it to charge very fast (less than 150 nS according to simulations to almost 100%). The complete charge causes the capacitor to be cut-off.
According to Kirchhoff's voltages law:
(1) $Vin = V_{DS} + V_{cable} + V_{R3} + V_{out}$
(2) According to Ohm's law:
(3) $Vin = V_{DS} + I \times R_{cable} + I \times R3 + V_{out}$
IF we place $I = V_{out}/R4$ into (2) we get:
(4) $Vin = V_{DS} + V_{out}/R1 \times (R_{cable} + R3) + Vout$
(5) $Vin - VDS - Vout - V_{out}/R1 \times R3 = Vout/R1 \times Rcable$
(6) $R_{cable} = R1/V_{out} \times (Vin - V_{DS} - V_{out}) - R3$ $V_{DS}$ value around 0.2V. The exact $V_{DS}$ value may be found by measurements on the circuit board 100. According to cable length there is an expected value for $R_{cable}$. If the result value for $R_{cable}$ is too high (e.g. at least 3 times more than typical) according to a chosen accuracy, then it means that a weak crimp exists. The accuracy can be 20%-30%. In other words, the at least one cable 140 resistance changes according to the cable length. The cable typical resistance will be calculated according to the cable length which will be inputted by the user to the application for example in the external devices 150.

Figure 6:
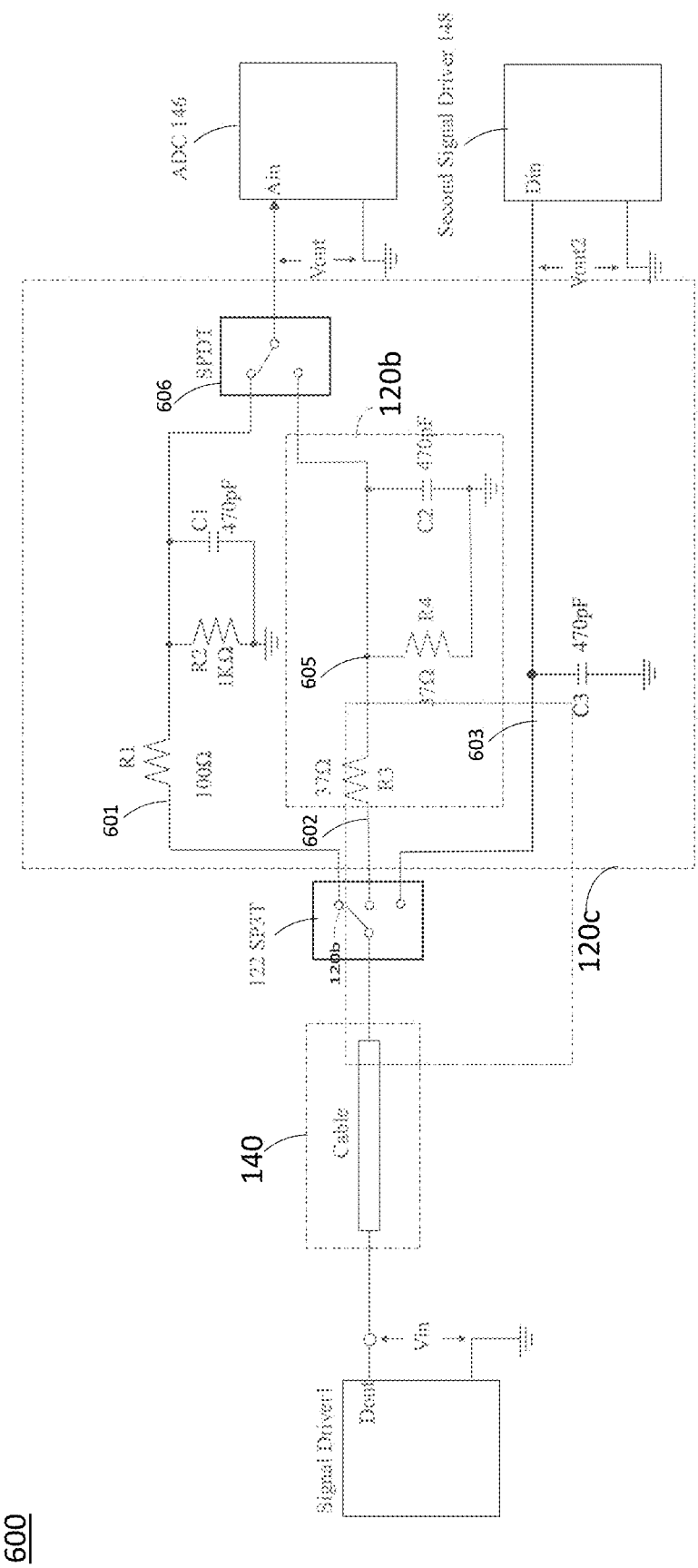
FIG. 6 shows an input circuit which includes three paths, in accordance with embodiments of the present disclosure.

For simplifying the calculations on the at least one processor 110 and in accordance with embodiments, the at least one processor 110 may be used only for sampling Vout. Then Vout value is transferred to an electrical entity, such as the external devices 150 which are configured to manage the board (with the at least one processor 110). The external device 150 can be for example a tablet or a smartphone or any device which contains one or more processors such as a CPU. Then the equation for $R_{cable}$ is calculated by the one or more processors such as the processors of the external device 150. In accordance with embodiments, for implementing circuit 500, the SPXT 122 uses SP3T switch and input circuit 120c (implementation of Input Circuit 120 shown in FIG. 1A) comprising a 3th path comprising circuit 120b connected to the 3th path (path 603). This path will lead to the ADC 146. Accordingly, adding another path to circuit 500 provides circuit 600 which includes three paths, 601, 602 and 603 as illustrated in FIG. 6, in accordance with embodiments. The additional path 602 comprises a resistor R3 having a varying resistance of for example of 37Ω connected in series in point 605 to a circuit comprising resistor R4 and Capacitor C2. The other path 603 comprises capacitor C3 having for example 470 pF and connected in series to the Second signal Driver 148, while paths 601 and 602 are connected via SPDT 606 to the ADC 146.

In accordance with embodiments an op amp can be used to sample the voltage drop on cable 140. The op amp will also amplify this voltage drop to a level that can be easily detected by the ADC. From the ADC the value is passed to the at least one processor.

According to another embodiment, instead of adding the op amp, it is possible to use a high-resolution ADC—such as 16 bits (or more) ADC.

Figure 7A:
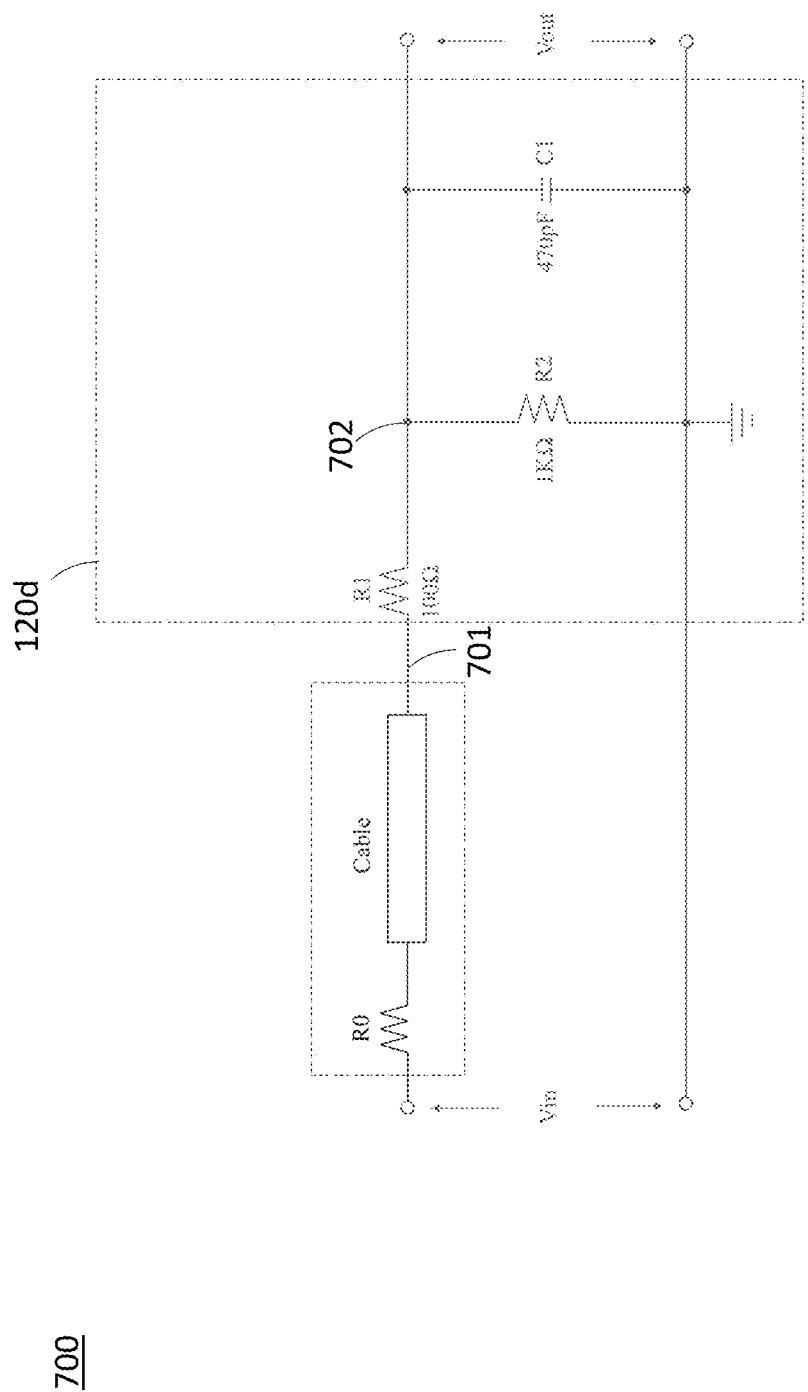
FIG. 7A shows an Input circuit for cable resistance calculation, in accordance with embodiments of the present disclosure.
Figure 7B:
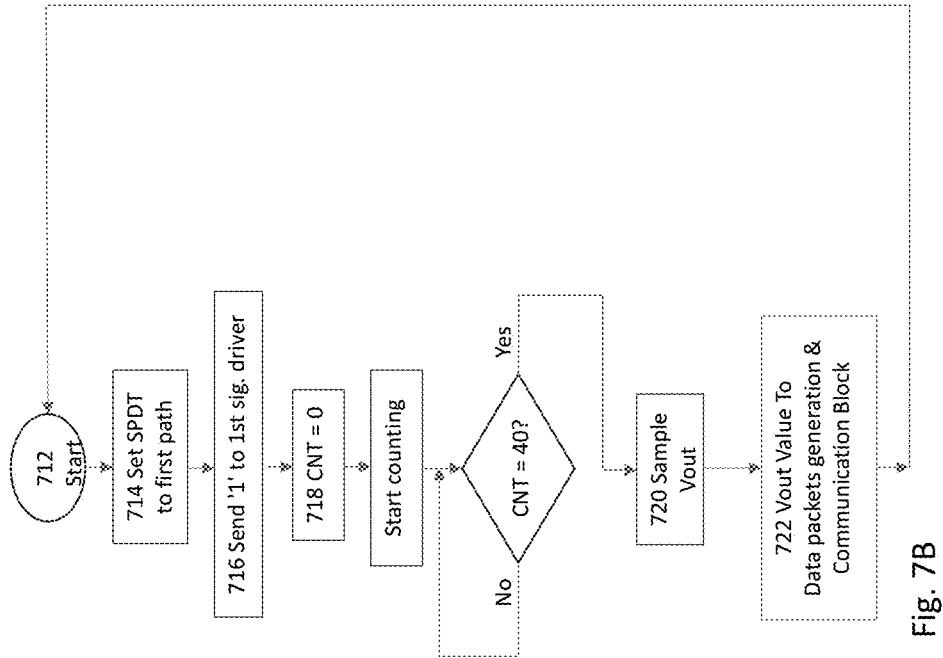
FIG. 7B shows a detailed flowchart of a method using the electrical circuit board for Resistance Check, in accordance with embodiments of the present disclosure.

FIG. 7A shows circuit 700 comprising an Input circuit 120d for cable resistance calculation and respectively FIG. 7B shows a flowchart 710 of a method using circuit 700 for Resistance Check, in accordance with embodiments. Resistance measurement is used for wires which are connected in series with a resistor at the tested cable. The parameters of Input Circuit 120d include:
R0+Cable are the tested cable which comprises an input resistor (R0).
Vin is the input power (3.3V) which is outputted by the signal driver of the electrical board
Vout is the sampled power by the ADC of the electrical board.
V0 is the voltage on R0
V1 is the voltage on R1
I is the current that flows through the circuit
Assumption1: the cable's resistance is neglectable;
Assumption2: C1 which is used to restrain noise and signal overshoot is negligible for the next equations. The reason for this is: the small value of C1 capacitor causes it to charge very fast (less than 300 nS according to simulations to almost 100%). The complete charge causes the capacitor to be cut-off.
The first path 701 comprises a resistor R1 having a varying resistance of for example of 100Ω connected in series in point 702 to a circuit comprising resistor R2 and Capacitor C1.
According to Kirchhoff's voltages law:

$$Vin = V0 + V1 + Vout \quad (1)$$

According to Ohm's law:

$$Vin = I \times R0 + I \times R1 + I \times R2 \quad (2)$$

$$I \times R0 = Vin - I \times R1 - I \times R2 \quad (3)$$

$$R0 = Vin/I - R1 - R2 \quad (4)$$

IF we place I=Vout/R2 into (4) we get:

$$R0 = Vin \times R2/Vout - R1 - R2 \quad (5)$$

In accordance with embodiments, equation (5) is used to calculate the resistance at the input of the cable. Then Vout value is transferred to an electrical entity, such as the external device 150 which is configured to manage the board such as board (with the at least one processor).

In accordance with embodiments, it is possible to measure resistances for example between 10Ω and 100 KΩ.

FIG. 7B illustrates a flowchart of a method 710 for measuring the Resistance of a cable, such as cable 140, using the at least one processor Check block 116 shown in FIG. 1C.

At step 712 the testing process performed for example by module 116 starts by receiving a command at the at least one processor 110, for example, a command initiated by the external devices 150 which are in communication with circuit board 100.

At step 714 the SPXT switch 122 is set to the first path 120' for connecting the Input Circuit 120 via the ADC 146 to the at least one processor 110 as shown in FIG. 1A and respectively in FIG. 2A. At step 716 a logic '1' is set and sent to the First Signal driver 128 by the at least one processor 110 for all wires of cable 140.

At step 718, the CNT is set to zero and the counting is repeated until it reaches for example 40. At step 720 the Sample Vout is sampled by the ADC of the electrical board and at step 722 the measured Vout is transmitted to the Data packets generation & Communication Block for further transmitting the Vout to one or more processors for example located in the external devices 150 for calculating the resistance at the input of the cable using for example Eq 5.

Wires Length Calculation Method

The calculation of wire length is predicated upon the speed of electricity traversing each wire. It is established that the speed of electricity is of the size of the speed of light, where light travels one meter in approximately 3.335 nanoseconds (nS). To enable the precise measurement of wires length using an electrical board, such as board 100, with an accuracy of, for instance, 0.5 meters, Nyquist's theorem dictates that the sampling rate must be at least twice the frequency of the signal being sampled.

In accordance with embodiments, a pulse (Test signals 119) is transmitted from one end of the tested cable to the other end. This pulse is sampled at its rising edge at two distinct points: initially, at the point of pulse generation within the at least one processor 110, and subsequently, after the signal has traversed the cable and re-enters the at least one processor 110 from the opposite end. This dual sampling technique enables the accurate determination of the wire length.

FIG. 8A illustrates a block diagram of an electrical circuit and logic design 800 for cable length calculation, in accordance with embodiments. The methods and systems in accordance with embodiments include increasing the sampling resolution by a factor of X (e.g. five) using X (e.g. five) clocks. The circuit 800 comprises a second signal driver 148 which is added for example in parallel to the ADC 146. For creating a fast-sampling rate, several fast clocks are comprised in the at least one processor. It is stressed that as the sampling rate is faster, the cable's measured length accuracy is higher. For example, five clocks of 200 Mhz which are shifted with 1 nS one of the other, can give +/−1 nS accuracy in the measurement. Relatively to the speed of light it is: +/−1/3.35 meters.

In some cases, five clocks having for example a frequency of 200 Mhz are used where each clock is included in the at least one processor 110, and differ one by the other with a phase of for example 1 nS. It is stressed that the frequency may be changed. In case five clocks of 200 Mhz are used, the clocks will be shifted by 1 nS one of the other to cover all the shifts of the 5 nS time period. For five clocks of 400 Mhz it would be 0.5 nS, for five clocks of 100 Mhz it would be 2 nS, and the like.

The frequency depends on the at least one processor 110 type. For example, in an enhanced processor it is possible to use a clock having a frequency of 400 Mhz or higher frequency clocks, specifically, for example, MAX10 FPGA family of Intel, 400 Mhz will be a maximum frequency. For Stratix10 of Intel, 1000 Mhz will be a maximum frequency and is therefore a processor more enhanced than MAX10 FPGA family. Using five clocks it is possible to get 1 nS resolution of sampling. For example:

Clock1 is 200 Mhz clock with 0 nS phase shift
Clock2 is 200 Mhz clock with 1 nS phase shift
Clock3 is 200 Mhz clock with 2 nS phase shift
Clock4 is 200 Mhz clock with 3 nS phase shift
Clock5 is 200 Mhz clock with 4 nS phase shift In accordance with embodiments, a counter runs at for example 200 Mhz on each of these clocks. The logic module 123 which uses these clocks and counter calculates the cable's length. For measuring the duration it takes for an electrical pulse to travel through a cable and return the counter advances between the time of the pulse generation (the starting point of the counting process which begins when an electrical pulse is initially generated and sent through the cable) and the time when the pulse arrives back from the cable end. In other words, the counter is used to measure the time interval between the moment the pulse (e.g. test signal 119) is generated and the moment it returns after traveling to the end of the cable and back. This time interval can then be used to calculate the length of the cable, knowing the speed of the electrical pulse (which is of the size of the speed of light in the medium). Additionally, in accordance with embodiments, calibrations are made to estimate the speed of electricity through the wire to achieve correct cable length measurement.

According to another embodiment the at least one processor 810 is configured and enabled to use a "slow" clock from an external clock generator IC 830 and multiply it to create fast clocks (200 Mhz). In other embodiments, the at least one processor 810 can generate the clocks with a phase shifted one by the other. This capability is implemented by using a PLL (Phase Lock Loop) 840 which is an internal silicon component inside the at least one processor 810.

It is to be understood that the embodiment illustrated in FIG. 8A may incorporate some or all of the elements described in FIG. 1A or FIG. 1B, as well as additional elements not previously depicted. The present disclosure contemplates various combinations and modifications of these elements to achieve the functionality described herein. For brevity, elements common to FIGS. 1A, 1B, and 8A may not be redundantly labeled or described in relation to FIG. 8A, unless specifically modified or relevant to the particular embodiment shown.

Figure 8B:
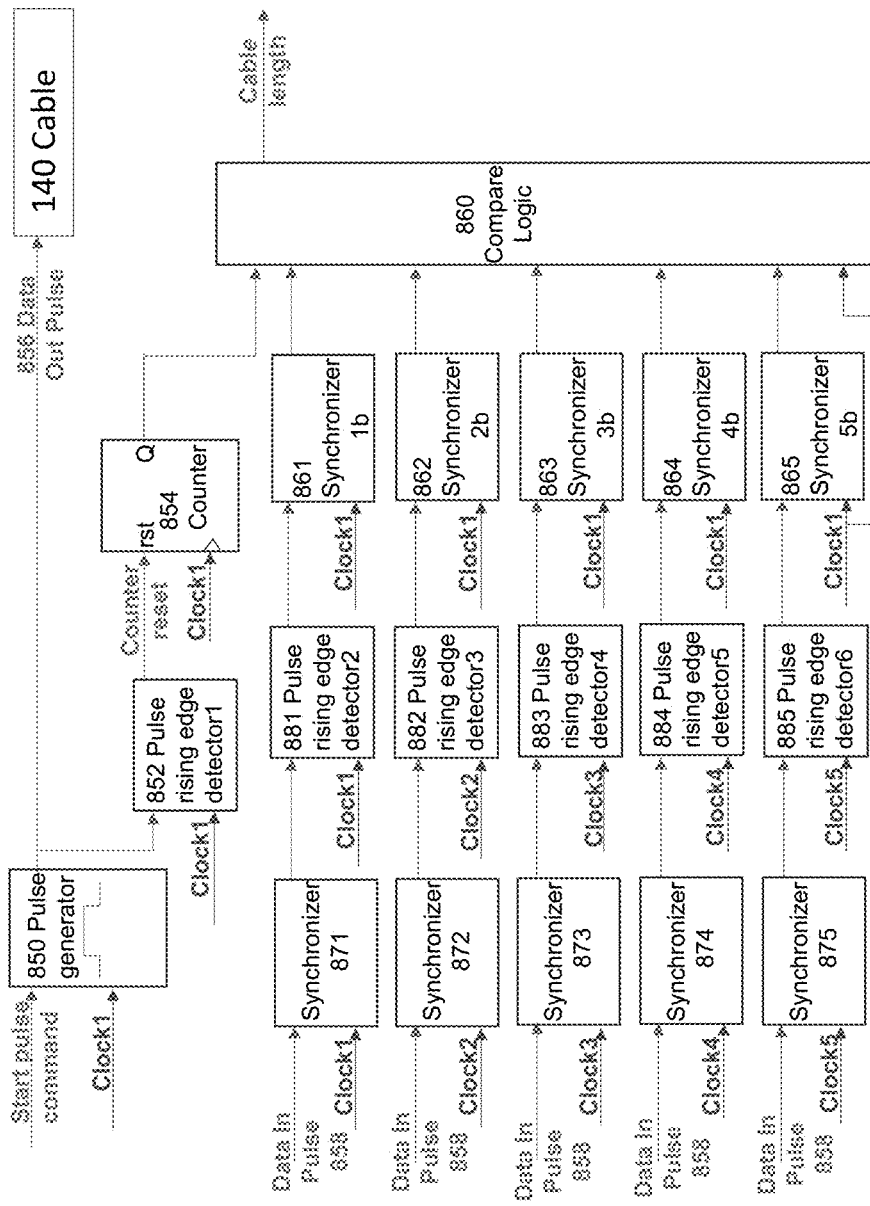
FIG. 8B illustrates a detailed view of the at least one processor logic flow for cable length calculation, in accordance with embodiments of the present disclosure.

FIG. 8B illustrates the at least one processor 810 logic flow for one output data line which connects to one wire of the at least one cable 140, in accordance with embodiments. It should be stressed that for all the output lines the logic is multiplied in the same way. As an example, five clocks (clock1-clock5) are produced by the PLL 840. Each clock is shifted by 1 nS relative to the other. A pulse of 4 clocks is generated by Pulse generator module 850. It should be stressed that the duration of the pulse does not have to be limited to 4 clock cycles, it can be longer, if necessary, i.e., it can remain in its high state for a longer period. This pulse is generated by clock1 (200 Mhz with 0 nS Phase). This pulse continues to two destinations: (1) outputted to the at least one cable 140 (2) to a first Pulse rising edge detector module 852 (Pulse rising edge detector 1). Pulse rising edge detector module 852 is configured and enabled to detect the rising edge of the pulse and outputs one clock width pulse with one clock latency. The Pulse rising edge detector module 852 is connected to the reset signal of the Counter module 854. In accordance with embodiments, when the counter module 854 receives the pulse from the Pulse rising edge detector 852 it starts counting from Zero. Accordingly, at each rising edge of clock1 its counting value increases by one. The counters' output is connected to Compare logic module 860. Additionally, a Data out pulse 856 is outputted from the Pulse generator 850 to the at least one cable 140. This pulse returns from the cable's 140 other side as Data in pulse 858. The Data in pulse 858 is sampled for example by five synchronizers modules 871-875.

Figures 8C, 8D:
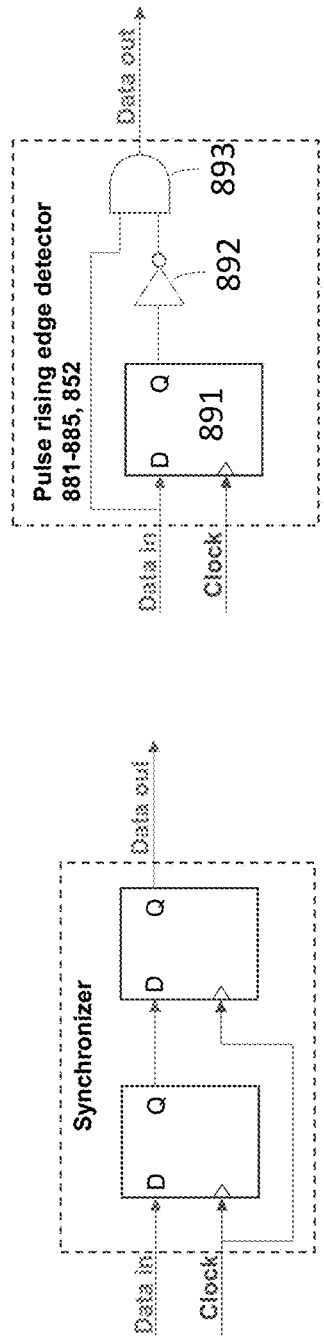
FIG. 8C shows an example of a synchronizer circuit, in accordance with embodiments of the present disclosure.
FIG. 8D shows an example of a Pulse rising edge detector, in accordance with embodiments of the present disclosure.

As illustrated in FIG. 8C each of the Synchronizers 871-875 comprise two D.Flip-Flops for respectively receiving the Data in Pulse 858 and clock1-clock5 signals, in accordance with embodiments. The synchronizers, 871-875, are specifically configured and enabled to mitigate and manage metastability issues that may arise due to the transfer of signals between clock domains such as clock1-clock5. These synchronizers 871-875 role is to minimize flip-flops metastability phenomenon which may occur when signals traverse from one clock domain to another, thereby ensuring the reliable and stable operation of the system. Another purpose of the synchronizers 871-875 are to align the Data in pulse 858 to the relevant clock domain (clock1, clock2, clock 3, clock4 or clock 5). In such a way, the sampling resolution of the rising edge of the Data in pulse is 1 nS (e.g. where the resolution depends on the clocks quantity and on the clocks frequency as explained above). The synchronizers outputs are connected respectively to Pulse rising edge detectors modules 881-885.

As illustrated in FIG. 8D, in accordance with embodiments, each of the Pulse rising edge detector modules 852, 881-885 comprises one D.Flip-Flop 891, in accordance with embodiments. The D.Flip-Flop 891 is connected to a Not gate 892 and to an And gate 893.

According to another embodiment, for increasing the Pulse rising edge detector module's maximum speed, it is possible to add another D.Flip-Flop between the Not gate and the And gate. Each Pulse rising edge detector detects the rising edge of Data by outputting a one clock width pulse with one clock latency in reference to the rising edge of the output pulse from the synchronizers 871-875. These Pulse rising edge detectors outputs are connected, respectively, to another set of synchronizers 861-865. These synchronizers align the pulse to clock1 domain. This step is necessary in order to enable the compare logic module 860 to work in one clock domain.

Figure 8E:
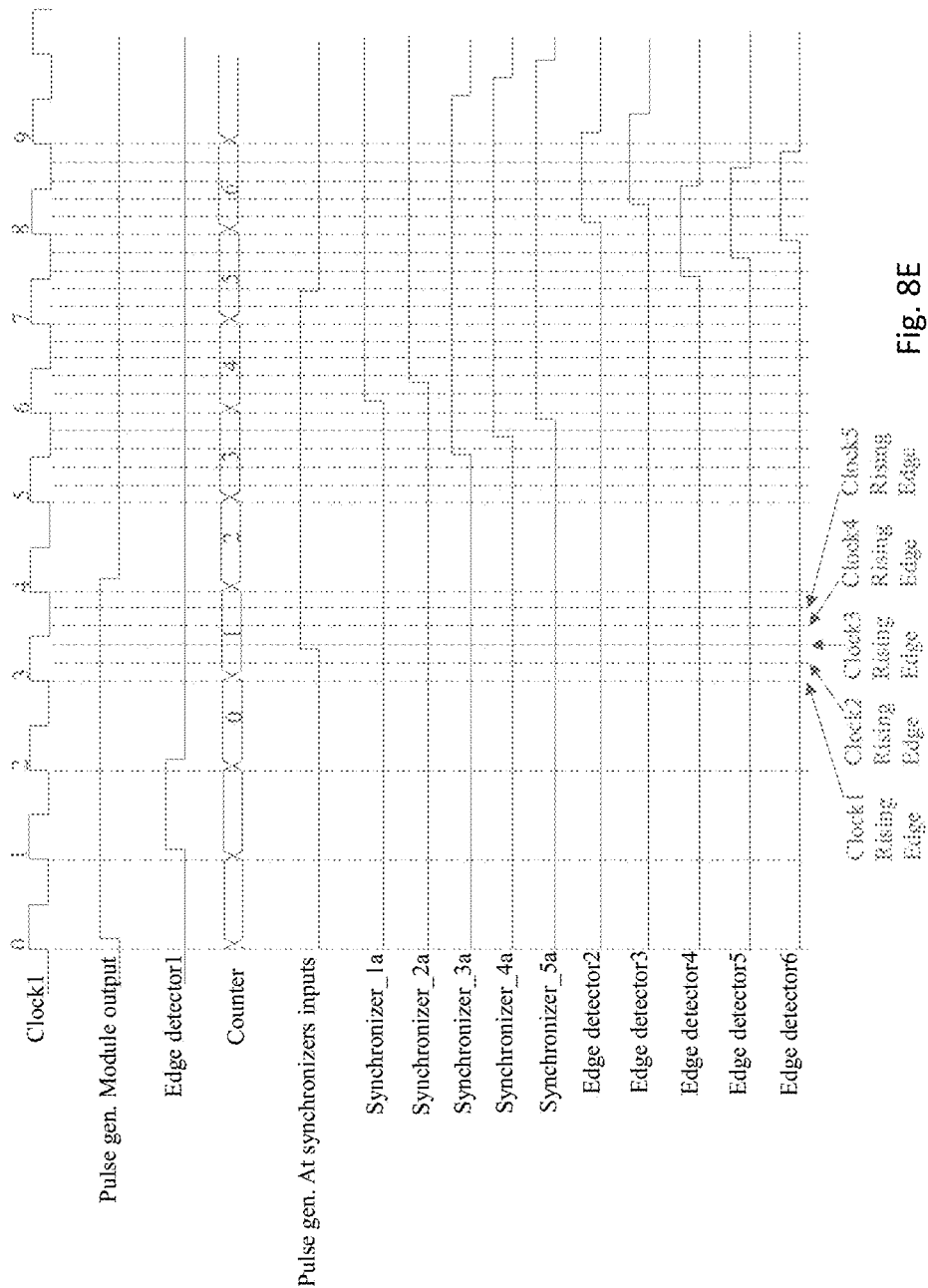
FIG. 8E and FIG. 8F show an example of logic design timing diagrams, in accordance with embodiments of the present disclosure.
Figure 8F:
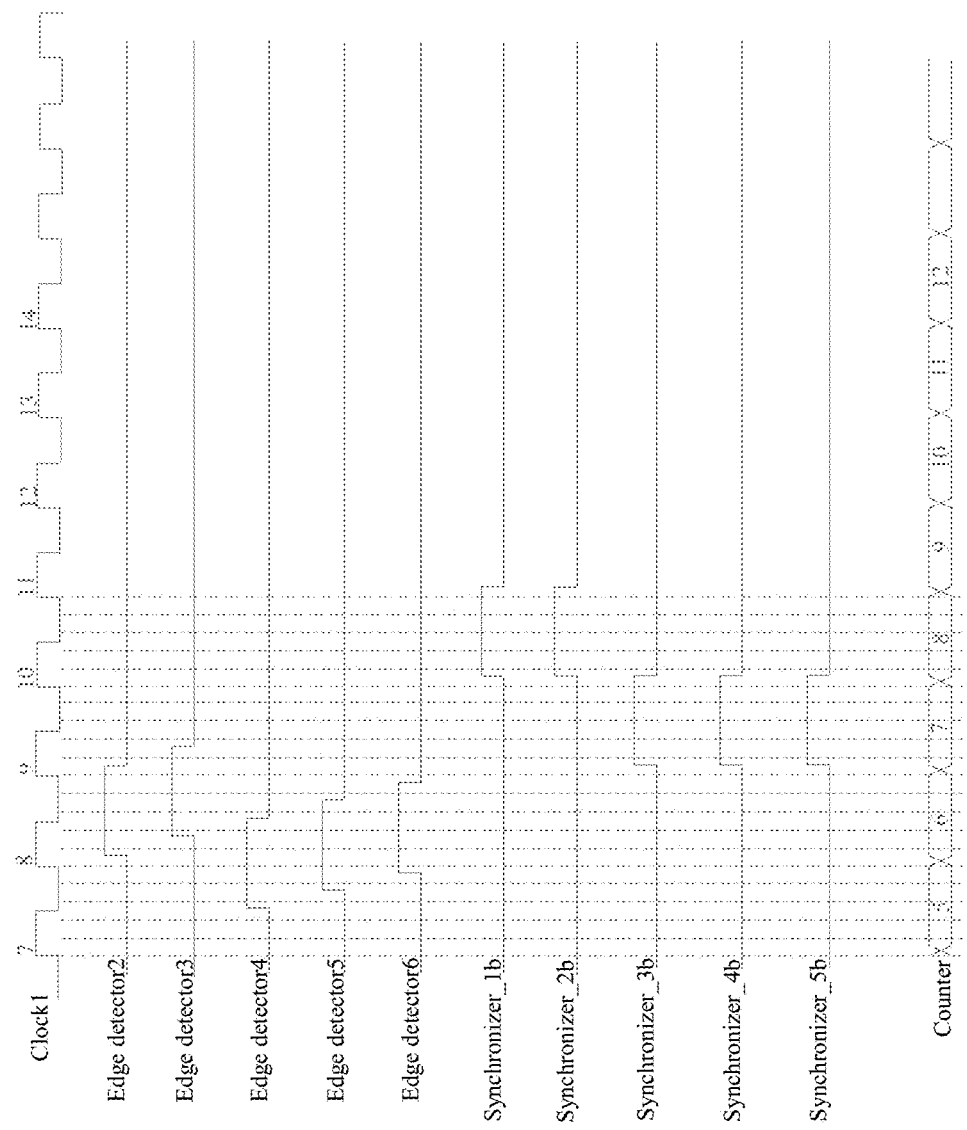
Figure 9E:
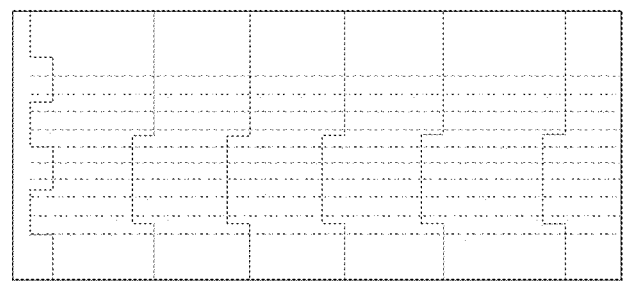
FIG. 9A, FIG. 9B, FIG. 9C, FIG. 9D and FIG. 9E show examples of five, respective, phase pulse result possibilities for five clocks in accordance with embodiments of the present disclosure.
Figure 9D:
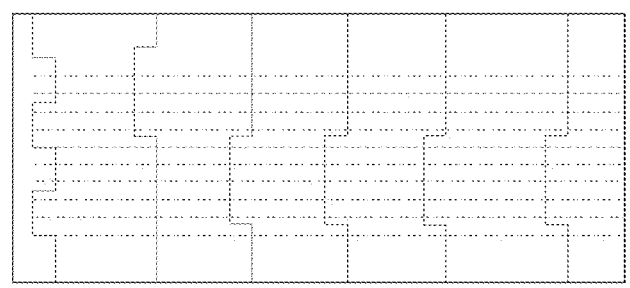
Figure 9C:
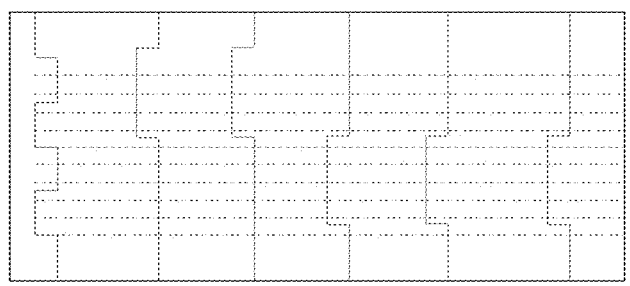
Figure 9B:
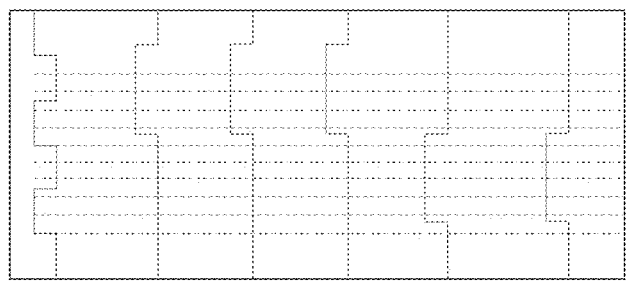
Figure 9A:
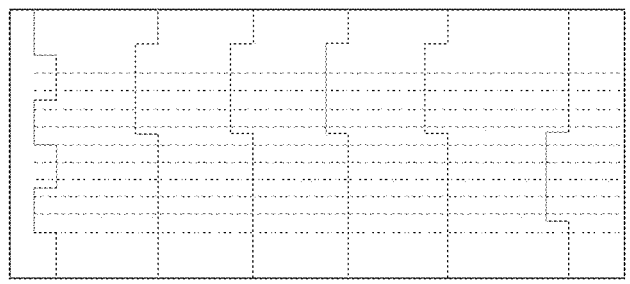

FIG. 8E and FIG. 8F show the logic design timing diagram, in accordance with embodiment. This timing diagram illustrates a specific example when the tested cable length is 1.5 m long. As illustrated, the delay between the pulse at Pulse generator module 850 output and between the synchronizers inputs is 16 nS. This time $t_{delay}$ is calculated as follows:

$$t_{delay} = t1 + t2 + t3 + t4 + t5 = 16 \text{ nS}$$

t1—routing delay+pin delay from Pulse generator output to at least one processor output pin=2 nS
t2—Output signal driver propagation delay=3 nS
t3—1.5 m cable delay=6 nS
t4—Input signal driver propagation delay=3 nS
t5—routing delay+pin delay from at least one processor input pin to synchronizers=2 nS
t1 and t5 are typical at least one processor delay timings
t2 and t4 are received from the signal driver's datasheet
t3 time assumes that the speed of electricity through the cable is 4 nS per 1 meter.

It should be stressed that t3 is derived of the electricity speed through the cable. The electricity speed depends on the cable's material type. This speed is of the size of light.

As illustrated in FIG. 8F, the first synchronizers that output a positive pulse are: Synchronizer_3b, Synchronizer_4b and Synchronizer_5b. This positive pulse occurs while the counter arrives to '7'. This number together with 5 clocks shifts position (see FIGS. 9A, 9B, 9C, 9D, 9E) makes it possible to calculate the cable's length: from '7' we shall decrease 4 clocks for logic latency in the at least one processor. Three clocks of 200 Mhz are 15 nS long. From 15 nS we shall subtract the time of t1+t2+t4+t5=10 nS. We shall get 5 nS. To this number we shall add 2 (the number of the delayed clocks: Synchronizer_1b, Synchronizer_2b). So, we get 7 nS which is equivalent to 7/4=1.75 m.

The real cable length is 1.5 m, so the calculation error is 0.25 m. Despite of the timing estimation and calculation, in accordance with some embodiments, to be on the safe side, a calibration with an oscilloscope is used with a very short cable to measure the board's latency. In addition, several test case cables of known lengths will also be used for this calibration.

In general, and as illustrated in FIG. 9A, FIG. 9B, FIG. 9C, FIG. 9D and FIG. 9E there are five, respective, phase pulse result possibilities for the five clocks (clock1-clock5) after the second set of synchronization by the synchronizers 861-865, 0 nS phase pulse result, 1 nS phase pulse result, 2 nS phase pulse, 3 nS phase pulse result, 4 nS phase pulse result. The phase pulse results are received at the Compare Logic module 860 which converts the phase pulse results to the cable length.

Figure 10A:
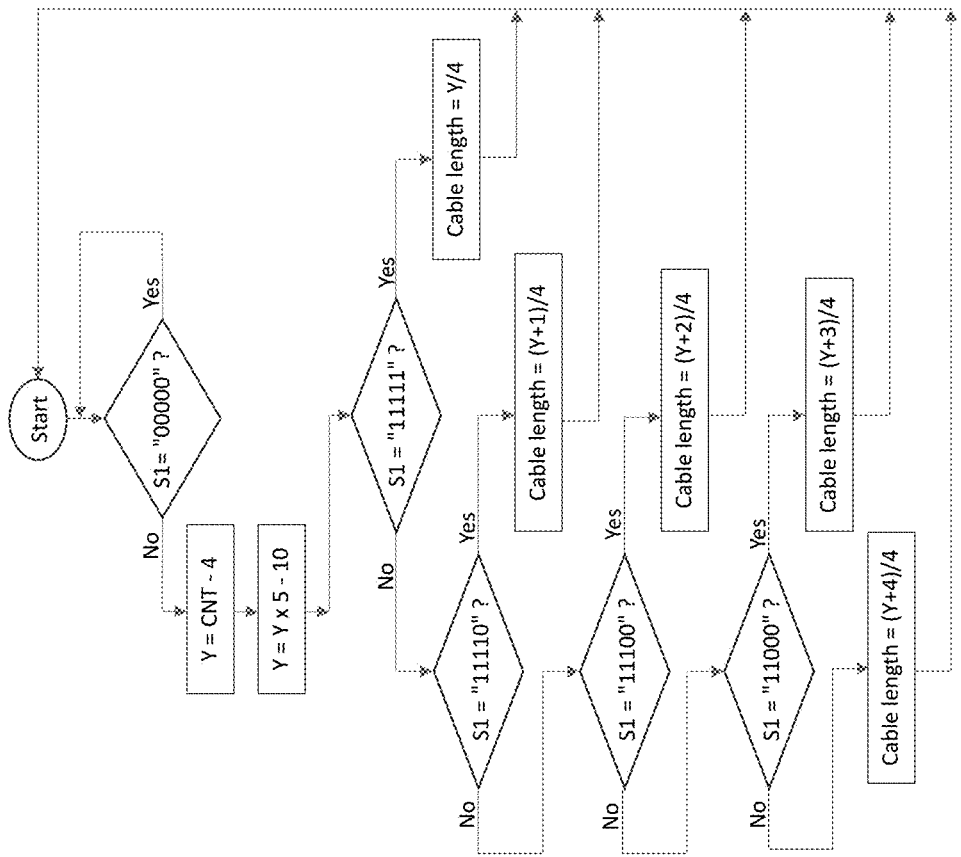
FIG. 10A shows a flow chart of a method for measuring cable length, and specifically for converting phase pulse results to a cable length using a logic module, in accordance with embodiments of the present disclosure.

FIG. 10A shows a flowchart 1000 of a method for measuring cable length, and specifically for converting phase pulse results to a cable length using a logic module, such as the Compare logic module 860, in accordance with embodiments.

In accordance with embodiments, the five synchronizers 861-865 are configured and enabled to produce respective five output signals. These five output signals are represented as a 5-bit vector denoted as 'S1', illustrated in FIG. 10B. The vector S1 can take one of only five possible values: "00000", "11110", "11100", "11000", or "10000". Specifically, the five synchronizers 861-865, shown in FIG. 8B, receive consecutive clock signals that are phase-shifted relative to each other by a fixed time period of for example 1 nanosecond. Because the clock signals are consecutively phase-shifted by 1 nanosecond, the outputs of the five synchronizers transit in a specific sequential pattern between logic 0 and logic 1 values as the clock signals propagate through the synchronizers. This sequential transition pattern results in the 5-bit vector S1, representing the five synchronizers outputs, being restricted to only five possible values.

Figure 10B:
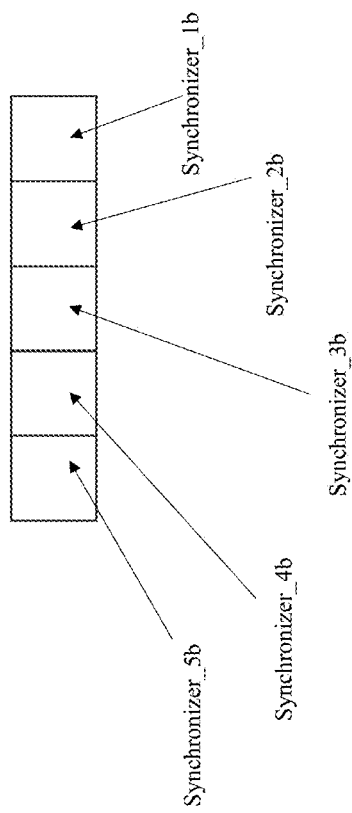
FIG. 10B shows an example of five synchronizers outputs by a five bits vector, in accordance with embodiments of the present disclosure.

Flowchart 1000 specifically illustrates the process for converting the value of counter 854 from FIG. 10B, which is performed as follows:

Let's denote: counter value=CNT

Following a Start command which may be received for example from the external device(s) 150, S1 vector value is checked. If S1 vector value is not equal to 00000 the flow continues. In the next stage, a variable—Y contains the number of clocks counted by the counter 854. Subtraction of 4 from Y is done to compensate for 4 clocks delay, for example, according to the description explained above. Then a multiplication by 5 is done to pass to the nS time resolution. The substruction is done according to the description as explained above. At the following step, S1 value is checked in several conditions. According to S1 value Y is corrected by 0 nS, 1 nS, 2 nS, 3 nS or by 4 nS accordingly. After adding Y the relevant of the 5 values, it is divided by 4 in order to convert Y to distance. The division by 4 is done for the specific checked cable 140 in the example, the speed of electricity speed through the cable is 4 nS for 1 m. After the division by 4, the final value of the cable length is applied.

Figure 11:
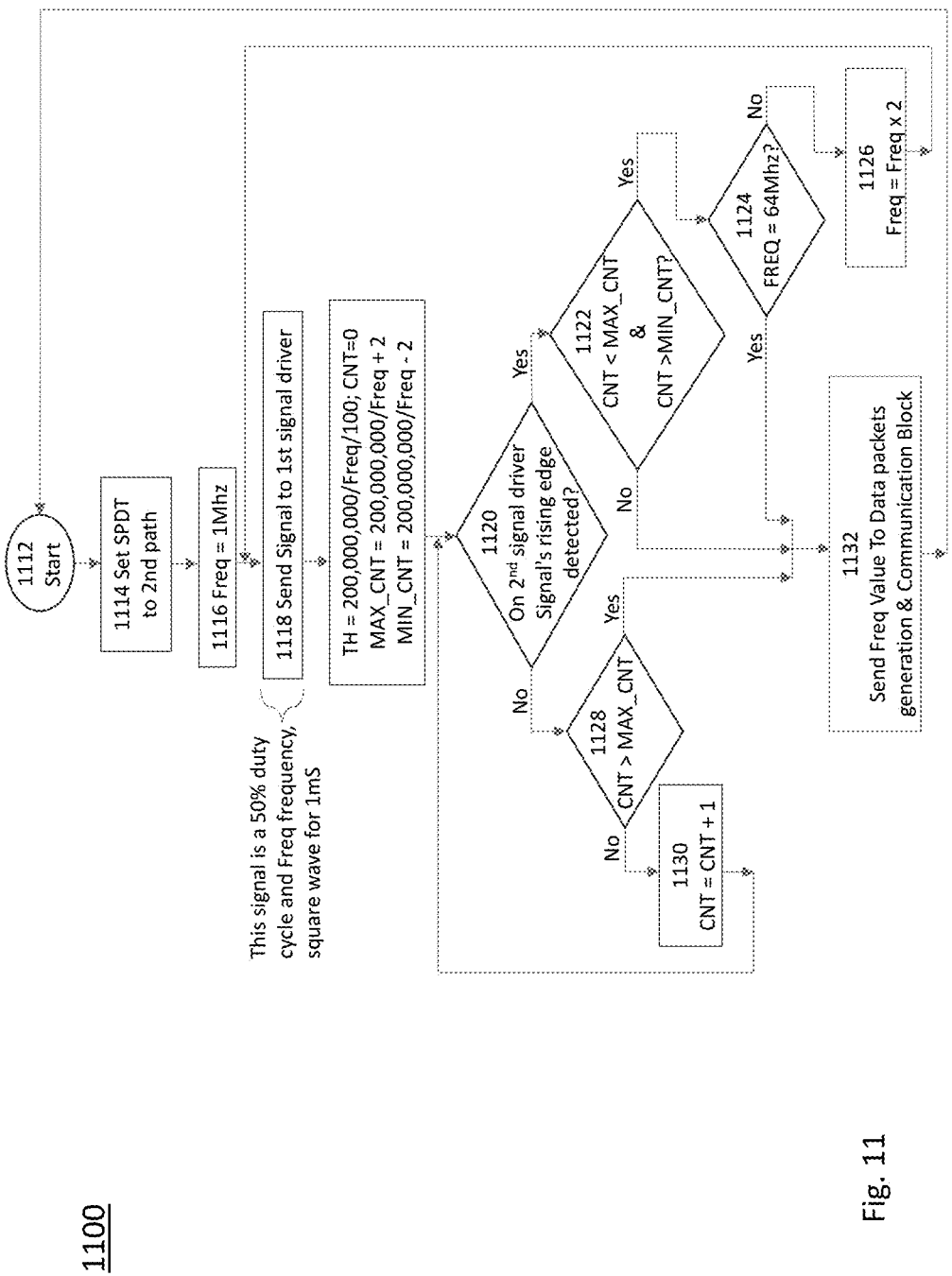
FIG. 11 shows a flow chart of a method for checking of a maximum Frequency value of a cable, in accordance with embodiments of the present disclosure.

FIG. 11 shows a flow chart 1100 of a method for measuring a Frequency value of a cable, such as the at least one cable 140 using circuit board such as board 100 shown in FIG. 1A which uses path 120" which passes through the second signal driver 148, in accordance with embodiments.

At step 1112 the Frequency check (e.g. Maximum frequency check) process starts by receiving a command at the at least one processor 110, for example initiated by the external device(s) 150 which is communicating with the at least one processor 110 through UART to Bluetooth converter 142 or through UART to USB converter 144. In accordance with embodiments, the Frequency check (e.g. Maximum frequency check) process is performed by the Frequency check module 113.

At step 1114 the SPXT switch 122 (e.g. SPDT) is set to the second path 120" for connecting the Input Circuit 120 via the Second Signal Driver 148 to the at least one processor 110 as shown in FIG. 1A and respectively in FIG. 1B.

At step 1116, the at least one processor 110 sets the Freq to 1 Mhz and on step 1118 a pulse with duty cycle of for example 50% with the frequency of 1 Mhz is generated. It is emphasized that a frequency of 1 MHz represents a relatively low starting point for cable inspection. It is stressed that it is not mandatory to initiate measurements at 1 MHz. For broader applicability, a starting frequency in the range of 0.5 MHz to 2 MHz is considered reasonable and acceptable for the purposes of cable evaluation. This pulse is transmitted through each one of the cable's 140 wires. When the pulse returns to the at least one processor 110 it enters into a for example 200 Mhz counter which counts the pulse frequency. At step 1120 conditional statement for checking if the pulse frequency is identified at the 2nd Driver 148 (e.g. driver Signal's rising edge detected?). In case, 'yes' and the pulse frequency is identified then at steps 1222-1126 another pulse is generated, but with for example 2 Mhz frequency. Again, the pulse is sent through the cable at step 1118 and checked in the at least one processor 110 by the counter's result. This check is repeated but each time with a frequency which is twice higher than the frequency in the previous check. This multiplication of the frequency continues until the frequency reaches 64 Mhz at condition 1124. Then from condition 1124 the flow continues to step 1132 where the frequency value (64 MHz) is sent to compare logic module 860. At any check, if at step 1120 the frequency is not identified, then the result which is set is the frequency of the previous check. At this step this check is completed and the flow continues to the step 1132 where the frequency value (64 MHz) is sent to Data packets generation & Communication Block 118.

In accordance with embodiments, in case a 200 Mhz clock is used in the at least one processor 110, the highest frequency that can be checked is 100 Mhz instead of 64 Mhz.

Wires Series Capacitance Calculation Method

Figure 12A:
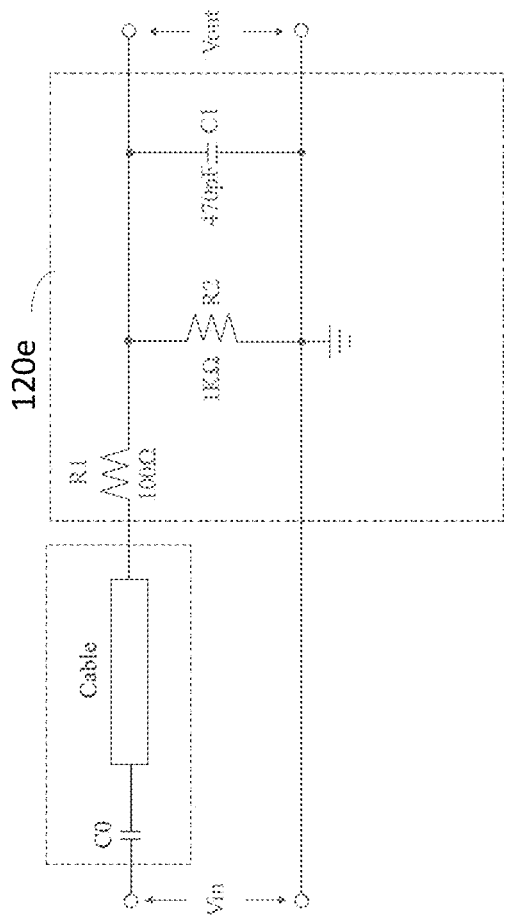
FIG. 12A illustrates an input circuit used for calculating a cable's wires series capacitance, in accordance with embodiments of the present disclosure.

FIG. 12A illustrates an input circuit 1201 used for calculating a cable's wires series capacitance, comprising input circuit 120e in accordance with embodiments. The cable may be for example the at least one cable 140 shown in FIG. 5B.

The input circuit 120e comprises two resistors R1 (100Ω) and R2 (1KΩ) and two capacitors C0 and C1, where C0 is the external input capacitance to the cable. This method comes to calculate this input capacitance. In an embodiment, the two serial resistors R1 and R2 connected to the at least one cable 140 and a capacitor C1 is parallelly connected to resistor R2.

The following assumption is made regarding circuit board 1201 structure: The capacitor C1, which is used to restrain noise and signal overshoot is negligible for the following equations. This assumption can be justified by the relatively small capacitance value of C1 on the circuit board 1201 structure, which facilitates rapid charging dynamics (less than 300 nS according to simulations to almost 100%). The complete charge causes the capacitor to be in cut-off.

Let's denote:
$CT=(C0 \times C1)/(C0+C1)$ as the total capacitance in the input circuit.
$V_0$—Voltage of C0
Charging voltage equation of the total capacitance looks as follows:

$$V_0 = V\text{in}(1 - e^{-t/((R1+R2) \times C0)}) \quad (1)$$

$$V_{out} + V_{R1} = V\text{in} - V_0 \quad (2)$$

$$1.1 V_{out} = V\text{in} \times e^{-t/((R1+R2) \times C0)} \text{Because } V_{R1} = 0.1 V_{out} \quad (3)$$

$$e^{-t/((R1+R2) \times C0)} = 1.1 V_{out}/V\text{in} \quad (4)$$

$$-t/((R1+R2) \times C0) = \text{LAN}(1.1 V_{out}/V\text{in}) \quad (5)$$

$$C0 = -t/((R1+R2) \times \text{LAN}(1.1 V_{out}/V\text{in})) \quad (6)$$

Vin of the input circuit is 3.3V
R1=1KΩ, R2=100Ω
Accordingly, the desired capacitance is the result of equation (6).

Figure 12B:
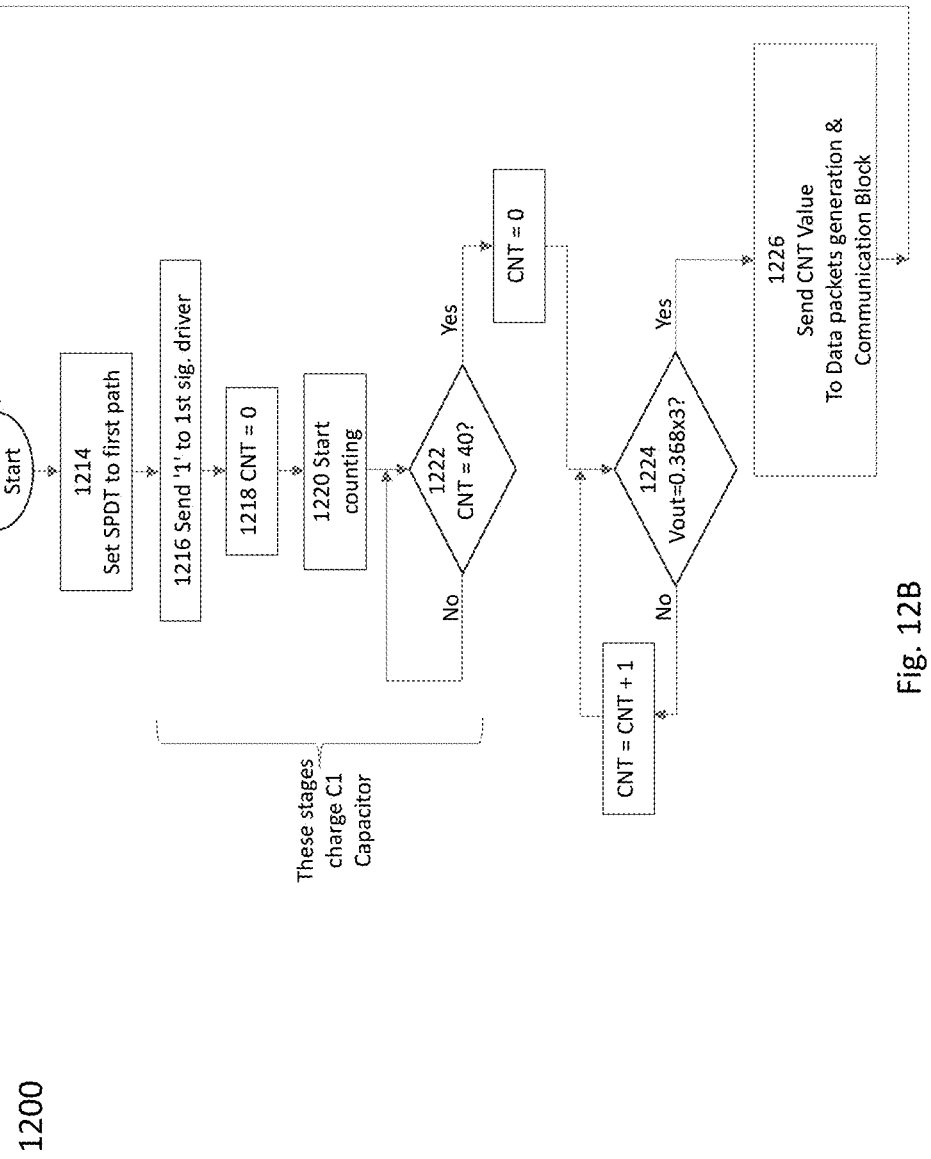
FIG. 12B shows a flowchart of a method for checking Capacitance using for example input circuit of FIG. 12A, in accordance with embodiments of the present disclosure.

FIG. 12B shows a flowchart 1200 of a method for checking Capacitance using for example circuit 1201, in accordance with embodiments.

The method includes at steps 1212-1224 using the at least one processor 110 for sampling Vout. The t value is transferred to a device including a processor such as External device 150 which manages the board (with the at least one processor). The processor of the External device 150 or processor 110 is configured and enabled to calculate the capacitance based on Eq (6). In some cases, the equation can use libraries which define LAN and exponent functions.

In the following flow chart steps at step 1224 there is a check if Vout got to 36.8% of 3. 63.2% is the Voltage percentage on C0 capacitor (in reference to the maximal 100%). So, on the R1+R2 There will be 36.8% of the maximal Voltage (Which is equal to Vin). 3 is Because the maximal voltage that can be on R2(On Vout) is 3.3×R2/(R1+R2)=3V, according to resistors divider rule.
t value which is transferred is expressed by CNT×20 nS. Because the boards' oscillator is 50 Mhz, each CNT tick takes 20 nS. In other words, t value is the time at which the voltage Vout equals 0.368×3. When condition 1224 exists, the t of this condition is transferred to the external device 150.

Board's Communication

In accordance with embodiments, the communication protocol of a circuit board, such as electrical circuit board 100, comprises two types of communication processes: transmitting commands to the circuit board and receiving data outputs (results) from the electrical circuit board 100.

Figure 13A:
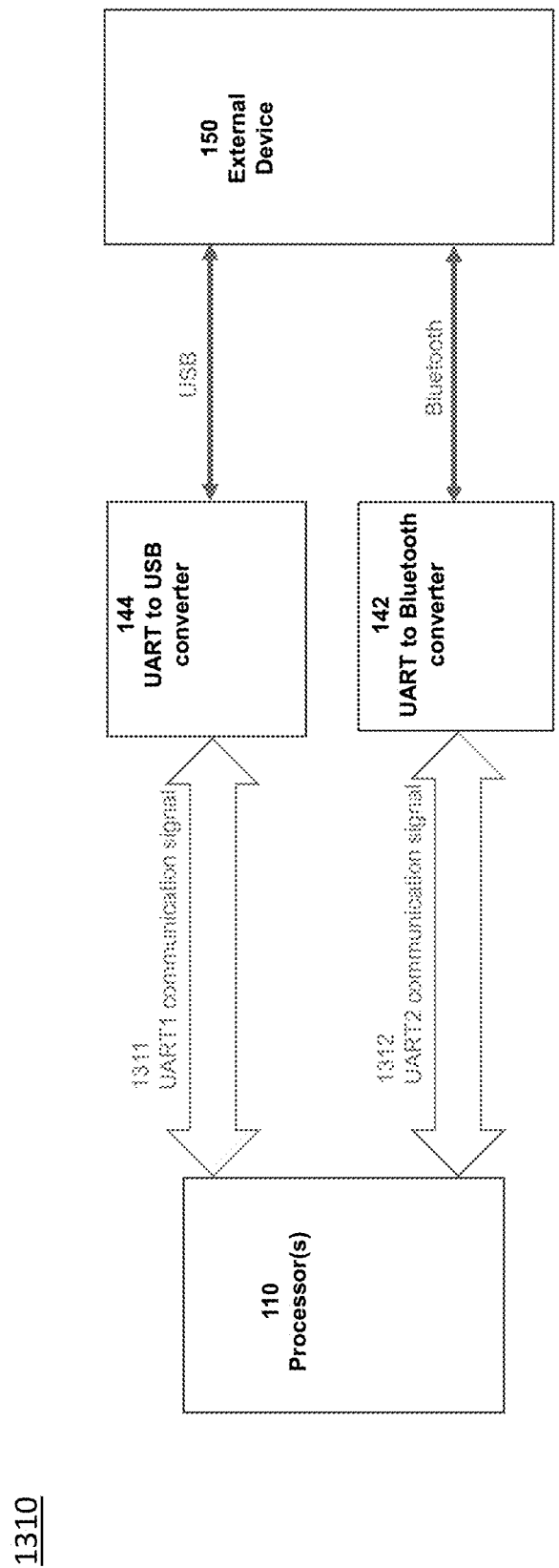
FIG. 13A is a block diagram of the Board's communication interfaces, in accordance with embodiments of the present disclosure.

FIG. 13A is a block diagram of the Board's communication interfaces 1310, in accordance with embodiments. As mentioned above, in accordance with some embodiments, the testing process begins by receiving "Start" command via one on ore more communication interfaces such as USB or Bluetooth communication interfaces. In some cases, the communication directly to the at least one processor 110 includes using Universal Asynchronous Receiver/Transmitter (UART) protocol, such as asynchronous serial communication between the circuit board 100 (e.g. at least one processor 110) and an external device 150 such as a smart phone. In some embodiments, a 'Start Command' may be transmitted to the circuit board 100 by the external device 150 which may be an Android device and/or include an Android board (such as a smartphone). The Android device or Android board is configured to receive the testing results from the circuit board 100. Alternatively, the 'Start Command' may be initiated by other computing devices or embedded systems with equivalent functionality, which are also configured to receive and process the testing results.

In accordance with embodiments, the Android device or Android board are configured and enabled to run one or more proprietary applications for running and managing the circuit board 100 and receiving results from the circuit board 100. Additionally, the one or more applications are configured to present the results, for example, on a display or by transmitting the results to a cloud site. In some cases, communication signals (e.g. UART1 communication signal 1311 and UART2 communication signal 1312) are converted to USB signals or to Bluetooth signals by IC chips such as UART to Bluetooth converter 142 or the UART to USB converter 144.

In accordance with embodiments, the configuration of the circuit board 100 designates the circuit board 100 as a slave. This means that there is a master device (e.g. external device 150) that sends one or more commands to the board (the circuit board 100). In one case, the command may be a 'start command' for starting cable calculations. At the end of the calculations, the electrical circuit board 100 sends automatically the results to the master. Another possible command by the master may be 'Get version', As a reply to this command the board sends back to the master the board's version.

FIG. 13B, FIG. 13C, FIG. 13D and FIG. 13E show various physical master-slave connection options for cable testing following cable manufacturing, in accordance with embodiments.

FIG. 13B illustrates an example of a Point-to-Point USB configuration, in accordance with embodiments.

FIG. 13C illustrates an example of a Point-to-Multipoint USB configuration, in accordance with embodiments.

FIG. 13D illustrates an example of a Point-to-Point Bluetooth configuration, in accordance with embodiments.

FIG. 13E illustrates an example of a Point-to-Multipoint Bluetooth configuration, in accordance with embodiments.

In many cases the cable ends will often be positioned far apart from each other, typically in cases where the cable is already installed in the field. In such cases, a single circuit board, such as electrical circuit board 100 will not be suitable for performing the cable checking process. Therefore, for such cases, two circuit boards using wireless platforms such as Bluetooth platform may be used, in accordance with embodiments.

Figure 14:
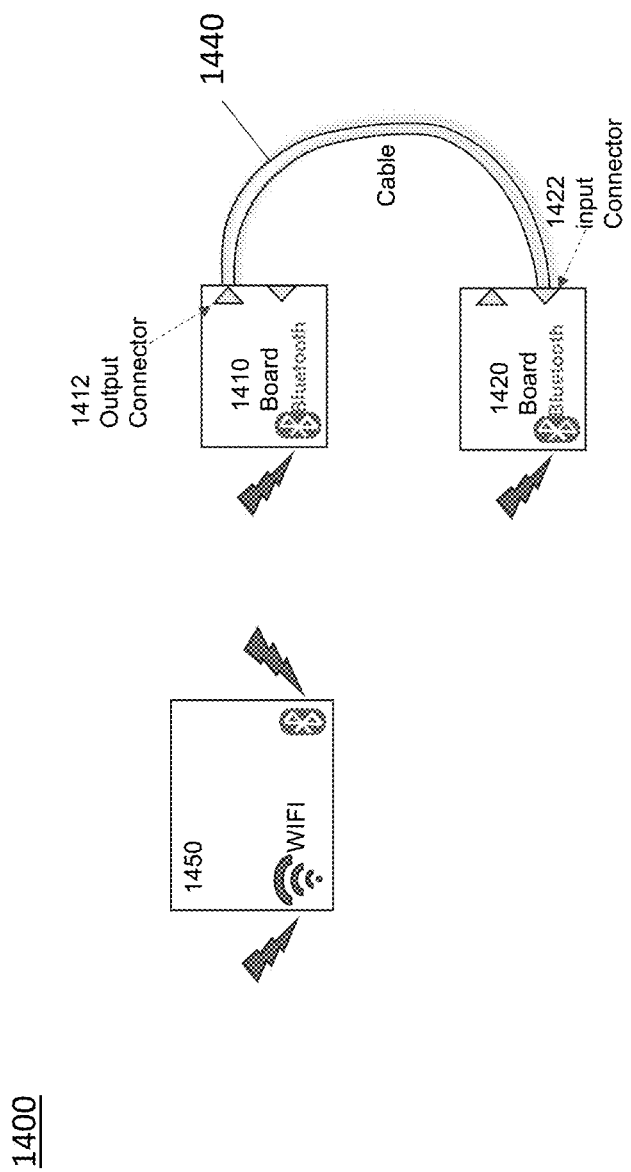
FIG. 14 illustrates a cable check method and system for cases where the cable is already installed in the field, in accordance with embodiments of the present disclosure.

FIG. 14 illustrates a cable 1440 check method and system 1400 for cases where the cable is already installed in the field, in accordance with embodiments. The system comprises a first circuit board 1410 and a second board 1420, wherein the first circuit board 1410 is configured and enabled to generate the test patterns while the second board 1420 is configured and enabled to perform the tests. The second board 1420 is also configured to transmit back the results to a master device such as an external device 1450 (e.g. Smartphone/Tablet/HMI).

In one embodiment, the first end of cable 1440 is connected to an output connector 1412 of the first board 1410 and the second end of the cable 1440 is connected to an input connector 1422 of the second board 1420.

In cases where direct Bluetooth communication will not work between the second board 1420 to the master device 1450, Bluetooth repeaters may be placed at relevant positions between the second board 1420 and the master device 1450 so that Bluetooth communication will work correctly.

Figure 15:
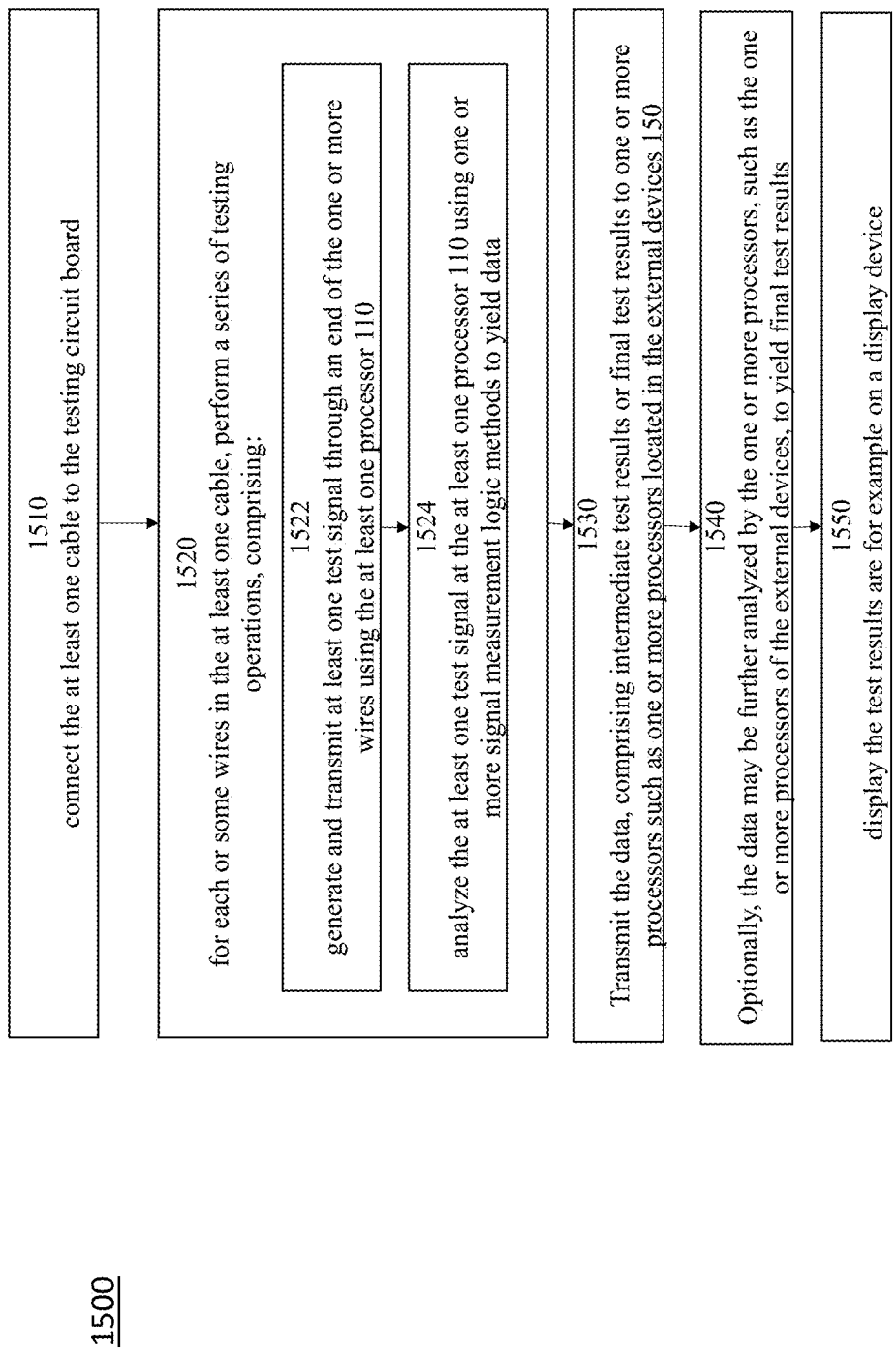
FIG. 15 shows a flowchart of a method for testing at least one cable, comprising one or more wires, for detecting one or more faults or identifying characteristics of the one or more wires, in accordance with embodiments of the present disclosure.

FIG. 15 shows a flowchart of a method 1500 for testing at least one cable, comprising one or more wires, the wires comprising one or more fibers, for detecting one or more faults or identifying characteristics of the one or more wires in the cables such as Wires length, and other features as detailed above. Electrical circuit board 100 and/or one or more external devices 150 may be used to implement method 1500. However, method 1500 may also be implemented by systems, electrical circuit board or processors having other configurations as described above.

At step 1510, the at least one cable 140 is connected to the testing circuit board, in accordance with embodiments. At step 1520 for each wire (or some wires) in the at least one cable, a series of testing operations are performed, in accordance with embodiments. In some cases, the testing operations instructions are received from one or more processors such as one or more processors included in one or more devices such as external devices 150. In some cases, the testing processes are automatically performed for various types of cable tests such as:

Testing for shorted wires;
Testing for cut-off or severed wires;
Testing connection integrity, such as weakly connected wires, corrosion, moisture ingress or damage which may cause resistive faults;
Testing resistance of external resistors connected to the wires;
Testing Wires series capacitance check;
Testing Wires length.
Testing cable's maximum frequency In some embodiments, the user may select the order of the testing type, according to the need and urgency, for example the user may select only two testing types such as:

Testing Wires series capacitance check;
Testing Wires length.

In accordance with embodiments, a dedicated application is generated, which the user may download onto a compatible device, such as the external devices 150. Upon launching the application, a graphical or textual interface is presented to the user, displaying various cable testing options available for selection. The user may then interact with the interface to choose a desired testing option, thereby initiating the corresponding test procedure.

In accordance with embodiments the testing operation steps comprise:

At step 1522, generating and transmitting at least one test signal, such as test signal 119 using the at least one processor 110 through an end of the one or more wires of the at least one cable 140, using for example circuit board 100, in accordance with embodiments.

At step 1524, the at least one test signal 119 are analyzed by the at the at least one processor 110 using one or more signal measurement logic methods to yield data. In some embodiments the data comprising intermediate test results or final test results which relate to one or more faults in said at least cable or to characteristics of the at least one cable. For example, the final test results may include comprehensive information about the condition and characteristics of the tested cables or wires such as information on: shorted wires; cut-off wires; weakly connected wires; Wires resistance level; Wires length; Frequency check (e.g. maximum frequency check); and Wires series capacitance check.

In some embodiments, the intermediate test results comprise raw test data, wherein the raw test data may be further processed by one or more additional processors, such as processors included in the one or more external devices 150, employing one or more known analytical methods for extracting final test results, the final test results providing comprehensive information about the condition and characteristics of the tested cable or cables. For example, intermediate results for capacitance measurements may include the potential voltage difference and for the final test results the capacitance result. In case the data is intermediate test results, the processor may further analyze the intermediate test results using known calculation methods to yield the final test results.

In some cases, the data comprises one or more data streams. The data streams include a structure which is identified by the software of the one or more processors, such as the processors of the external devices 150. In some cases, the structure comprises: Header, Message type, data field length, Data field, Checksum.

In accordance with embodiments, the at least one processor builds the data stream according to this structure.

In some cases, the analysis of step 1524 further includes recording the final test results and/or the intermediate test results.

At step 1530 the data, comprising intermediate test results or final test results is transmitted to one or more processors such as one or more processors located in the external devices 150. Optionally, at step 1540 the data may be further analyzed by the one or more processors, such as the one or more processors of the external devices, to yield final test results. For example, in some embodiments, in cases where the results are the intermediate test results, the analysis comprises employing one or more known analytical methods for extracting the final test results, the final test results providing comprehensive information about the condition and characteristics of the tested cable or cables.

In accordance with embodiments, where a frequency is mentioned, it may be any frequency in the range of 0.1 MHz to 1 GHz. Similarly, where a voltage is mentioned, it may be any voltage in the range of 0.4 V to 48 V.

In some embodiment the extraction process comprises identifying the header in the data stream. After the header is identified the processor extracts the rest of the fields. The checksum field is used to check the correctness of the data stream. If the checksum contains errors, then the data stream is requested again by the one or more processors of the external device from the at least one processor 110 of the board 100. According to the message type, the relevant function runs. In accordance with embodiments, the data included in the data field is used to present the final test results, or the intermediate test results.

In some embodiments, the one or more processors generate the final test results, for example, a comprehensive test report, wherein the test report includes details of detected faults and/or Cable characteristics, and/or further includes a pass/fail status for each wire and/or an overall pass/fail status for the at least one cable. In an embodiment the faults or characteristics comprise one or more of: shorted wires; cut-off wires; weakly connected wires; Wires resistance level; Wires length; Frequency check (e.g. Maximum Frequency check); and Wires series capacitance check such as results related to shorts, cut-offs, and other detected features. Specifically, in one embodiment, for shorted wire tests, the test results may include which wire number ends is shorted to which wire. For example "wire 1 end is shorted with wires 3, 4, 5 ends' and the like.

Optionally, at step 1550, the test results are displayed for example on a display device, such as a display device included or in communication with the external devices 150 and/or circuit board 100.

The terms "comprises", "comprising", "includes", "including", "having" and their conjugates mean "including but not limited to". This term encompasses the terms "consisting of" and "consisting essentially of". As used herein, the singular form "a", "an" and "the" include plural references unless the context clearly dictates otherwise.

It is to be understood that the reference numerals used in the drawings are for illustrative purposes only and do not limit the scope of the invention. Alternative numbering schemes may be employed without departing from the spirit and scope of the disclosed embodiments. The particular numbers assigned to elements in the drawings should not be construed as requiring a specific number of elements or a particular arrangement, unless explicitly stated otherwise in the description or claims.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. Each of the examples as described herein can be combined with one or more other examples. Further, one or more components of one or more examples can be combined with other examples.

Although the detailed description contains many specifics, these should not be construed as limiting the scope of the disclosure but merely as illustrating different examples and aspects of the present disclosure. It should be appreciated that the scope of the disclosure includes other embodiments not discussed in detail above. Various other modifications, changes and variations which will be apparent to those skilled in the art may be made in the arrangement, operation and details of the method and apparatus of the present disclosure provided herein without departing from the spirit and scope of the invention as described herein.

While preferred embodiments of the present disclosure have been shown and described herein, it will be obvious to those skilled in the art that such embodiments are provided by way of example only. Numerous variations, changes, and substitutions will be apparent to those skilled in the art without departing from the scope of the present disclosure. It should be understood that various alternatives to the embodiments of the present disclosure described herein may be employed without departing from the scope of the present invention. Therefore, the scope of the present invention shall be defined solely by the scope of the appended claims and the equivalents thereof.

What is claimed is:

1. An electrical circuit board for testing at least one cable, wherein the at least one cable comprises one or more wires, the circuit board comprising:
   an input connector configured to be connected to one end of the one or more wires of the at least one cable;
   an output connector configured to be connected to the other end of the one or more wires of the at least one cable;
   at least one processor connected via a first signal driver to the output connector, said first signal driver supplies an input voltage to the at least one cable;
   an Analog-to-Digital Converter (ADC) and a second signal driver, the ADC having an input connection coupled to an input circuit and an output connection coupled to the at least one processor, and the second signal driver having an output connection coupled to the at least one processor and an input connection coupled to the input circuit;
   an SPXT (single pole, X throw) switch connecting the input connector to the input circuit;
   an oscillator circuit coupled to the at least one processor, wherein the oscillator circuit is configured to provide a clock signal to the at least one processor;
   an energy source configured to supply input voltage to the electrical circuit board;
   wherein said at least one processor comprises a plurality of signal generation modules, said plurality of signal generation modules are configured to:
      generate and transmit at least one test signal through the end of the one or more wires of the at least one cable;
      receive the at least one test signal transmitted through the other ends of the one or more wires of the at least one cable; and
      analyze the at least one test signal using one or more signal measurement logic methods to yield data, said data comprising intermediate test results or final test results which relate to one or more faults in said at least one cable or characteristics of the at least one cable.

2. The electrical circuit board of claim 1, wherein said faults or characteristics comprise one or more of: shorted wires; cut-off wires; weakly connected wires; Wires resistance level; Wires length; Maximum Frequency check; and Wires series capacitance check.

3. The electrical circuit board of claim 1, wherein the plurality of signal generation modules comprises:
   a Shorted Wires Check Module, Cut Wires Check Module, a Frequency Check Module, a Weakly Connected Wires Check Module, Length Check Module, a Resistance Check Module, and a Capacitance Check Module, wherein each of said plurality of signal generation modules is configured for respectively checking: shorted wires; cut-off wires; weakly connected wires; Wires resistance level; Wires length; Maximum Frequency check; and Wires series capacitance check of said one or more wires.

4. The electrical circuit board of claim 1, further comprises a communication interface module which is in communication with said at least one processor, wherein the communication interface module is configured to transmit the data to at least one external device.

5. The electrical circuit board of claim 4, wherein the communication interface module comprises a Universal Asynchronous Receiver/Transmitter (UART) to Bluetooth Converter or a UART to Universal Serial Bus (USB) converter for establishing a communication link between the electrical circuit board and the at least one external device.

6. The electrical circuit board of claim 4, wherein the at least one external device is selected from the group consisting of:
   personal computer (PC), tablet, smart phone, tablet, mobile phone, HMI.

7. The electrical circuit board of claim 4, wherein said at least one external device further comprises additional one or more processors, wherein said additional one or more processors are configured to process said data to yield test results, said test results comprise the detected one or more faults or characteristics in said at least one cable.

8. The electrical circuit board of claim 1, wherein the one or more faults or characteristics are detected sequentially.

9. The electrical circuit board of claim 4, wherein the at least one external device comprises a display device and wherein the display device is configured to present information indicating the type of fault detected in the one or more cables.

10. The electrical circuit board of claim 1, wherein the at least one cable is a multi-wire cable.

11. The electrical circuit board of claim 1, wherein the oscillator circuit is a 50 MHz oscillator.

12. The electrical circuit board of claim 1, wherein the at least one processor is connected in series to the output connector via the first signal driver.

13. The electrical circuit board of claim 1, wherein the energy source comprises a primary electrical energy source configured to supply an input voltage to one or more Power Converters.

14. The electrical circuit board of claim 13, wherein the input voltage is 5V.

15. The electrical circuit board of claim 13, wherein the one or more Power Converters comprise three different power convertors configured to convert the input voltage to a plurality of output voltages suitable for the electrical circuit board.

16. The electrical circuit board of claim 15, wherein the plurality of output voltages are selected from the group consisting of: 1.2V, 2.5V, 3.3V.

17. The electrical circuit board of claim 1, wherein the energy source is connected via a Universal Serial Bus (USB) connector to the electrical circuit board.

18. The electrical circuit board of claim 1, wherein the one or more wires length is examined with accuracy of at least 0.5 meter.

19. The electrical device of claim 3, wherein the at least one processor comprises a Data packets generation and Communication module which is in communication with the Shorted Wires Check Module, Cut Wires Check Module, Frequency Check Module, Weakly Connected Wires Check Module, Length Check Module, Resistance Check Module, and a Capacitance Check Module, and wherein each of the modules is configured and enabled to respectively receive signal inputs from the tested cable via the Data Packet Generation and Communication Module and analyze, respectively, said signal inputs.

20. The electrical circuit board of claim 1, wherein the test results comprise numerical results or pass or no pass results, or graphical presentations.

21. The electrical circuit board of claim 1, wherein the at least one processor is selected from the group consisting of:

CPU (Central Processing Unit), DSP (Digital Signal Processor), FPGA (Field-Programmable Gate Array), ASIC (Application-Specific Integrated Circuit), MCU (Microcontroller Unit), SoC (System on Chip), NPU (Neural Processing Unit), CPLD (Complex Programmable Logic Device), MPU (Microprocessing Unit), APU (Accelerated Processing Unit).

22. The electrical circuit board of claim 1, wherein the input circuit comprises a First and Second paths, the First path comprises a First resistor (R1) having a varying resistance connected in series to a circuit comprising a Second Resistor (R2) and a First Capacitor (C1) and the ADC, and wherein the second path comprises a second capacitor (C2) connected in series to the Second signal Driver.

23. The electrical circuit board of claim 1, wherein the input circuit comprises a First, Second and Third paths, the third path comprises a Third resistor (R3) having a varying resistance connected in series to a circuit comprising a Fourth resistor (R4) and a Second Capacitor (C2) and wherein the third path further comprises a third capacitor (C3) connected in series to the Second signal Driver and the First and Second paths are connected via the SPXT to the ADC.

24. The electrical circuit board of claim 1, wherein the SPXT switch is an SPDT (single pole, double throw) switch or SP3T switch.

25. The electrical circuit board of claim 1, wherein the at least one processor is configured to sequentially execute all types of cable test checks or selectively execute a subset of the cable test checks, or only one type of cable test check.

26. The electrical circuit board of claim 1, comprises one or more pull-down resistors which are placed on each output of the first signal driver and the second signal driver.

* * * * *